(12) United States Patent
Lee et al.

(10) Patent No.: US 10,980,158 B2
(45) Date of Patent: Apr. 13, 2021

(54) ELECTRONIC DEVICE HAVING SHIELD CAN STRUCTURE

(71) Applicant: Samsung Electronics Co., Ltd., Suwon-si (KR)

(72) Inventors: Sungyoung Lee, Suwon-si (KR); Changho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/971,631

(22) PCT Filed: Feb. 15, 2019

(86) PCT No.: PCT/KR2019/001882
§ 371 (c)(1),
(2) Date: Aug. 20, 2020

(87) PCT Pub. No.: WO2019/164190
PCT Pub. Date: Aug. 29, 2019

(65) Prior Publication Data
US 2020/0404815 A1 Dec. 24, 2020

(30) Foreign Application Priority Data
Feb. 21, 2018 (KR) .......................... 10-2018-0020678

(51) Int. Cl.
*H05K 9/00* (2006.01)
(52) U.S. Cl.
CPC ......... *H05K 9/0028* (2013.01); *H05K 9/0032* (2013.01)
(58) Field of Classification Search
CPC ........................... H05K 9/0032; H05K 9/0028
See application file for complete search history.

(56) References Cited

U.S. PATENT DOCUMENTS

| 6,545,871 B1* | 4/2003 | Ramspacher | ...... H05K 7/20445 165/185 |
|---|---|---|---|
| 6,673,998 B1* | 1/2004 | Wu | ...... H05K 7/2049 174/383 |

(Continued)

FOREIGN PATENT DOCUMENTS

| JP | 2002-064293 A | 2/2002 |
|---|---|---|
| JP | 2004-281986 A | 10/2004 |

(Continued)

OTHER PUBLICATIONS

International Search Report and Written Opinion of the International Searching Authority in connection with International Application No. PCT/KR2019/001882 dated May 23, 2019, 9 pages.

*Primary Examiner* — Hung V Ngo

(57) ABSTRACT

An electronic device according to various embodiments of the present disclosure may include: a printed circuit board including one face; at least one electronic component mounted on the printed circuit board; and a conductive shield can structure attached to the one face of the printed circuit board while surrounding the at least one electronic component. The conductive shield can structure may include: a first conductive plate including a first edge portion, a second edge portion spaced apart from the first edge portion, and a third edge portion extending between the first and second edge portions, and in top view of the one face of the printed circuit board, including a first flat portion parallel to the printed circuit board and constructing a recess together with the first to third edge portions; a second conductive plate including a fourth edge portion extending substantially parallel to the third edge portion, and in top view of the one face of the printed circuit board, including a second flat portion to be attached to the first flat part while at least partially overlapping the first flat portion; a first side portion extending along the first edge portion and substan- (Continued)

tially vertical to the first flat portion; a second side portion extending along the second edge portion and substantially vertical to the first flat portion; and a third side portion bent from the fourth edge portion while surrounding the third edge portion, and substantially vertical to the first flat portion.

15 Claims, 23 Drawing Sheets

(56) References Cited

U.S. PATENT DOCUMENTS

| | | | | |
|---|---|---|---|---|
| 7,119,286 B1* | 10/2006 | Horng | ............... | H05K 9/0032 |
| | | | | 174/379 |
| 7,663,895 B2* | 2/2010 | Huang | ............... | H05K 9/0032 |
| | | | | 361/818 |
| 7,884,288 B2* | 2/2011 | Meyer | ............... | H05K 9/0032 |
| | | | | 174/372 |
| 8,379,408 B2* | 2/2013 | Hankui | ............... | H05K 9/0032 |
| | | | | 361/818 |
| 9,968,014 B2* | 5/2018 | Tsai | ............... | H05K 9/0032 |
| 10,206,317 B2* | 2/2019 | Liukkonen | ............... | H05K 9/0032 |
| 10,306,815 B1* | 5/2019 | Kim | ............... | H05K 9/0015 |
| 2005/0219832 A1 | 10/2005 | Pawlenko et al. | | |
| 2007/0035938 A1 | 2/2007 | Rochford et al. | | |
| 2017/0181336 A1 | 6/2017 | Robinson et al. | | |
| 2017/0215305 A1* | 7/2017 | Price | ............... | H05K 9/0032 |

FOREIGN PATENT DOCUMENTS

| | | |
|---|---|---|
| JP | 2007-516591 A | 6/2007 |
| JP | 2007-266024 A | 10/2007 |
| JP | 2008-218526 A | 9/2008 |
| KR | 10-2014-0055755 A | 5/2014 |
| WO | 2016181553 A1 | 11/2016 |

* cited by examiner

ELECTRONIC DEVICE HAVING SHIELD CAN STRUCTURE

CROSS-REFERENCE TO RELATED APPLICATIONS

This application is a 371 National Stage of International Application No. PCT/KR2019/001882, filed Feb. 15, 2019, which claims priority to Korean Patent Application No. 10-2018-0020678, filed Feb. 21, 2018, the disclosures of which are herein incorporated by reference in their entirety.

BACKGROUND

1. Field

Various embodiments of the present disclosure relate to a conductive shield can structure included in an electronic device.

2. Description of Related Art

An electronic device such as a smart phone has a plurality of electronic components mounted on a printed circuit board disposed therein, and noise or the like may be produced from the mounted electronic components. A shield can may be provided to block the noise or the like produced in the electronic component. The shield can may be disposed to surround the plurality of electronic components.

SUMMARY

The conventional electronic device provides a conductive shield can which has a great loss of a component mounting space, and noise shielding performance may deteriorate at a corner portion of the shield can.

Various embodiments of the present disclosure may provide an electronic device having a conductive shield can structure capable of increasing a shielding area by optimizing a space of mounting an internal electronic component.

Various embodiments of the present disclosure may provide an electronic device having a conductive shield can structure with improved shielding performance.

An electronic device according to various embodiments of the present disclosure may include: a printed circuit board including one face; at least one electronic component mounted on the printed circuit board; and a conductive shield can structure attached to the one face of the printed circuit board while surrounding the at least one electronic component. The conductive shield can structure may include: a first conductive plate including a first edge portion, a second edge portion spaced apart from the first edge portion, and a third edge portion extending between the first and second edge portions, and in top view of the one face of the printed circuit board, including a first flat portion parallel to the printed circuit board and constructing a recess together with the first to third edge portions; a second conductive plate including a fourth edge portion extending substantially parallel to the third edge portion, and in top view of the one face of the printed circuit board, including a second flat portion to be attached to the first flat part while at least partially overlapping the first flat portion; a first side portion extending along the first edge portion and substantially vertical to the first flat portion; a second side portion extending along the second edge portion and substantially vertical to the first flat portion; and a third side portion bent from the fourth edge portion while surrounding the third edge portion, and substantially vertical to the first flat portion.

An electronic device according to various embodiments of the present disclosure may include: a printed circuit board; a first conductive plate including a first flat portion parallel to the printed circuit board; a second conductive plate, in top view of the one face of the printed circuit board, comprising a second flat portion to be attached to the first flat part while at least partially overlapping the first flat portion; a first side portion bent vertically from the first flat portion; a second side portion facing the first side portion in a state of being spaced apart, and bent vertically from the first flat portion; a third side portion bent vertically from the second flat portion and extending between the first and second side portions; and a fastening structure surrounded by a substantially equal distance from each of the first to third side portions.

A conductive shield can structure according to various embodiments of the present disclosure can minimize a loss of a component mounting space, thereby ensuring a shield area of internal electronic components.

A conductive shield can structure according to various embodiments of the present disclosure can improve shield performance.

DETAILED DESCRIPTION

Figure 1:
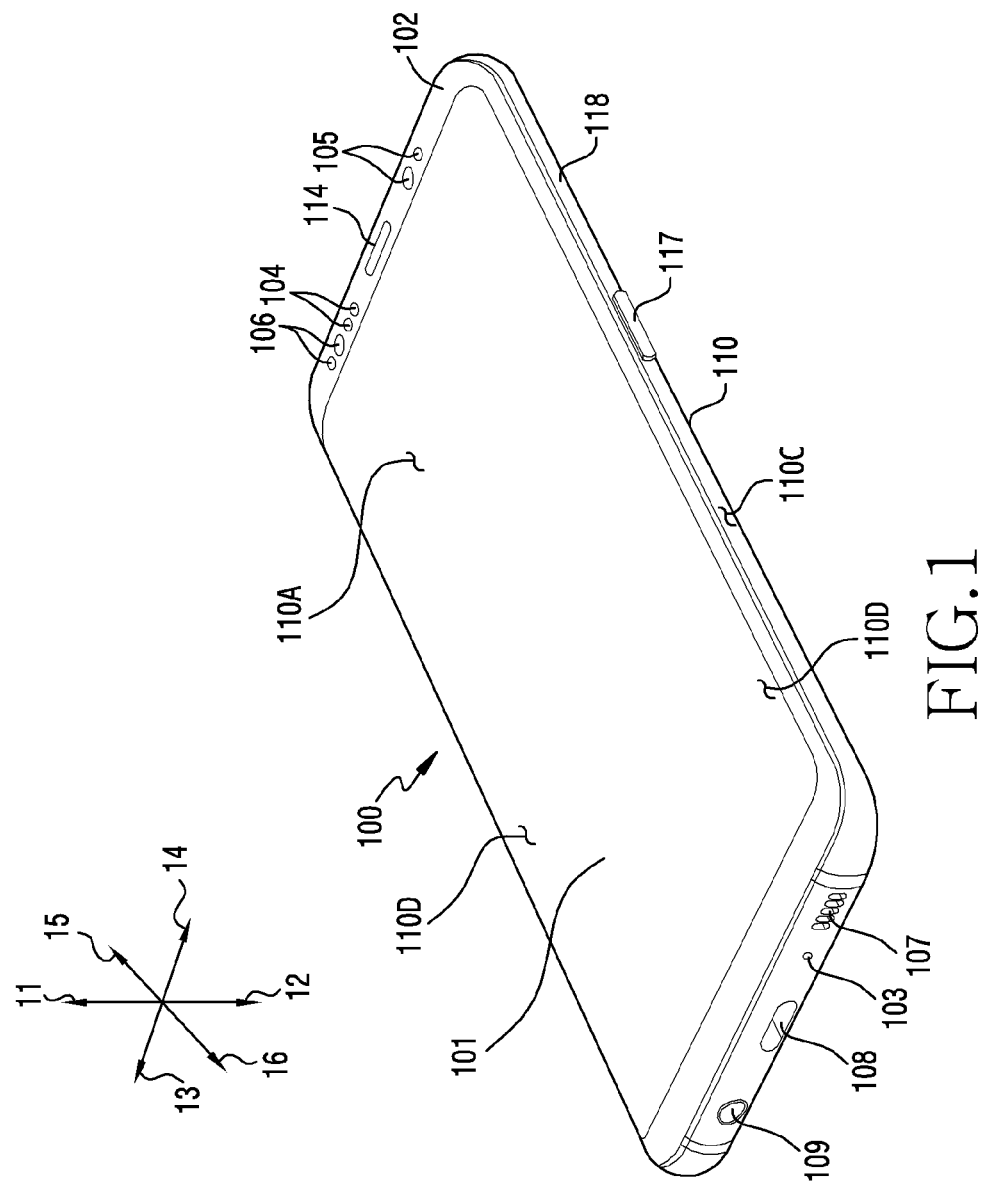
FIG. 1 is a front perspective view of an electronic device according to various embodiments.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Hereinafter, various embodiments of the present disclosure will be described with reference to the accompanying drawings.

Figure 2:
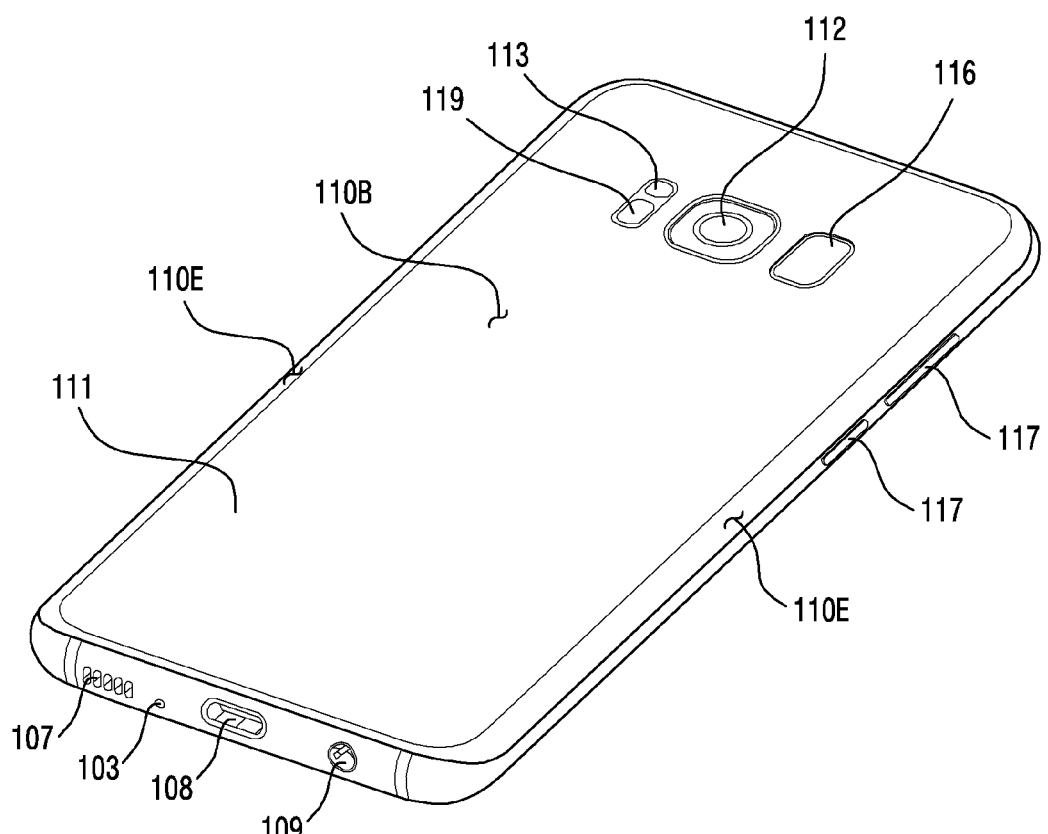
FIG. 2 is a rear perspective view of an electronic device of FIG. 1.

Referring to FIG. 1 and FIG. 2, an electronic device 100 according to an embodiment may include a housing 110 including a first face (or a front face) 110A, a second face (or a rear face) 110B, and a lateral face 110C surrounding a space between the first face 100A and the second face 110B. In another embodiment (not shown), the housing may refer to a construction which constitutes part of the first face 110A, second face 110B, and third face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of the these materials. The lateral face 110C may be constructed of a lateral bezel structure (or a lateral member) 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include only one of the first regions 110D (or the second regions 110E). In another embodiment, some of the first regions 110D or the second regions 110E may not be included. In the above embodiments, in a lateral view of the electronic device 100, the lateral bezel structure 118 may have a first thickness (or width) at a lateral face in which the first regions 110D or the second regions 110E are not included, and may have a second thickness thinner than the first thickness at a lateral face in which the first regions 110E or the second regions 110E are included.

According to an embodiment, the electronic device 100 may include at least one or more of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least a part of the display 101 may be exposed through the first face 110A and the front plate 102 constructing the first regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 110 and the front plate 102 may be constructed to have substantially the same interval between outer boundaries thereof.

In another embodiment (not shown), a part of a screen display region of the display 101 may have a recess or opening, and may include at least one or more of the audio module 114, sensor module 104, camera module 105, and light emitting element 106 which are aligned with the recess or the opening may be included. In another embodiment (not shown), at least one of the audio module 114, the sensor module 104, the camera module 105, the fingerprint sensor 116, and the light emitting element 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least a part of the sensor modules 104 and 119 and/or at least a part of the key input device 117 may be disposed to the first regions 110D and/or the second regions 110E.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker (e.g., a piezo speaker) may be included without the speaker holes 107 and 114.

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119 (e.g., a Heart Rate Monitoring (HRM) sensor) disposed to the second face 110B of the housing 110 and/or the fourth sensor module 116 (e.g., a fingerprint sensor). The fingerprint sensor may be disposed not only to the first face 110A (e.g., the display 101) but also the second face 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 105, 112, and 113 may include the first camera device 105 disposed to the first face 110A of the electronic device 100, the second camera device 112 disposed to the second face 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The light emitting element 106 may be disposed, for example, to the first face 110A of the housing 110. The light emitting element 106 may provide, for example, state information of the electronic device 100 in an optical form. In another embodiment, the light emitting element 106 may provide, for example, a light source interworking with an operation of the camera module 105. The light emitting element 106 may include, for example, an LED, an IR LED, and a xenon lamp.

The connector holes 108 and 109 may include the first connector hole 108 capable of housing a connector (e.g., a USB connector) for transmitting/receiving power and/or data of an external electronic device and/or the second connector hole (e.g., earphone jack) 109 capable of housing a connector for transmitting/receiving an audio signal with respect to the external electronic device.

Figure 3:
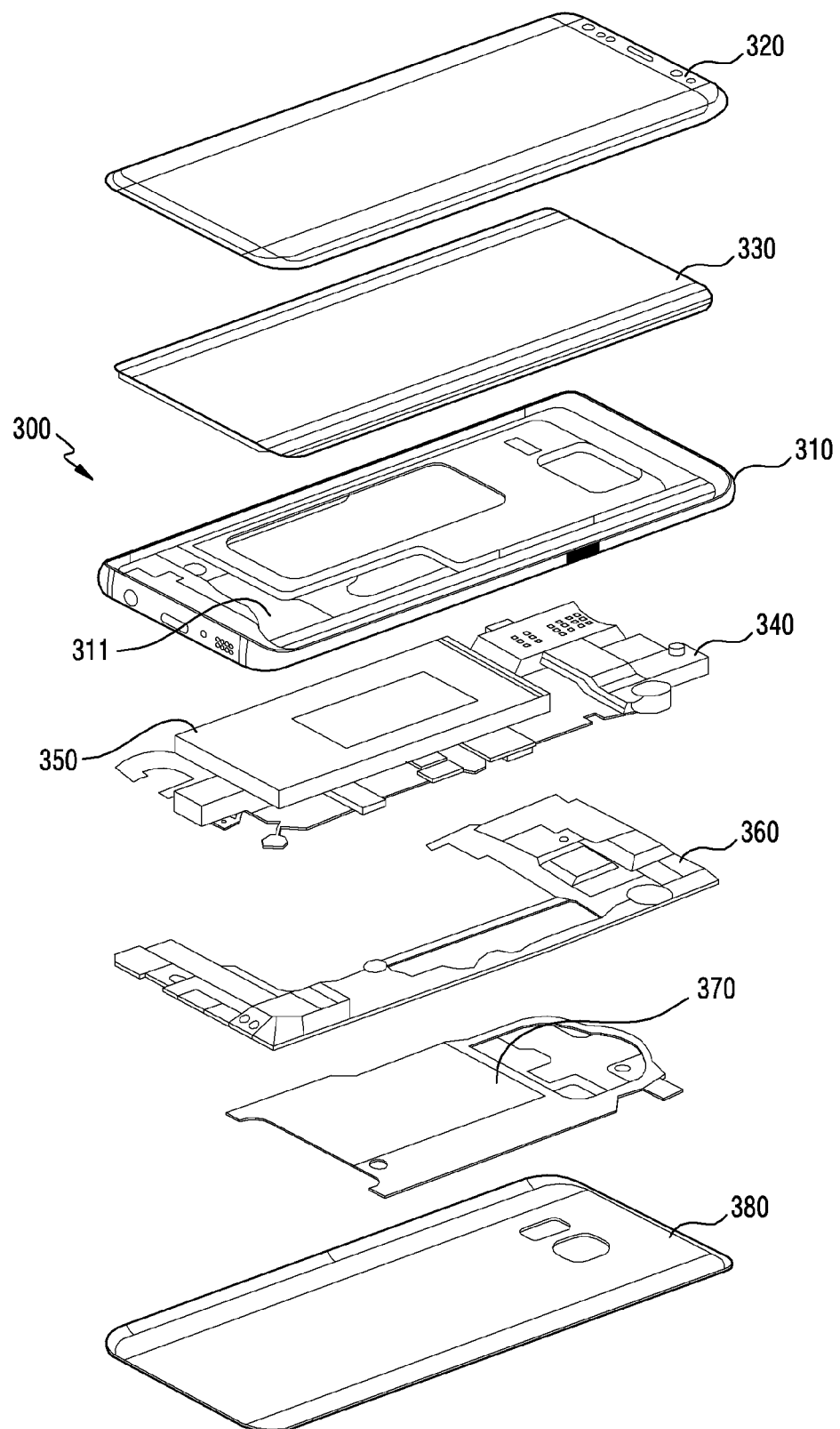
FIG. 3 is an exploded perspective view illustrating an internal structure of an electronic device of FIG. 1.

Referring to FIG. 3, an electronic device 300 may include a lateral bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel construction 310 by being disposed inside the electronic device 300, or may be constructed integrally with respect to the lateral bezel construction 310. The first support member 311 may be constructed of, for example, a metal material and/or non-metal material (e.g., polymer). The display 330 may be bonded to one face of the first support member 311, and the printed circuit board 340 may be bonded to the other face thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, a non-rechargeable primary cell, a rechargeable secondary cell, or a fuel cell. At least a part of the battery 350 may be disposed on the same plane substantially with respect to, for example, the printed circuit board 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform NFC, for example, with the external electronic device, or may wirelessly transmit/receive power required for charging. In another embodiment, an antenna construction may be constructed by at least a part of the lateral bezel construction 310 and/or the first support member 311 or a combination thereof.

Hereinafter, a conductive shield can structure mounted on an electronic device (e.g., the electronic device 100 of FIG. 1 and FIG. 2) according to various embodiments of the present disclosure will be described with reference to the accompanying drawings.

Figure 4A:
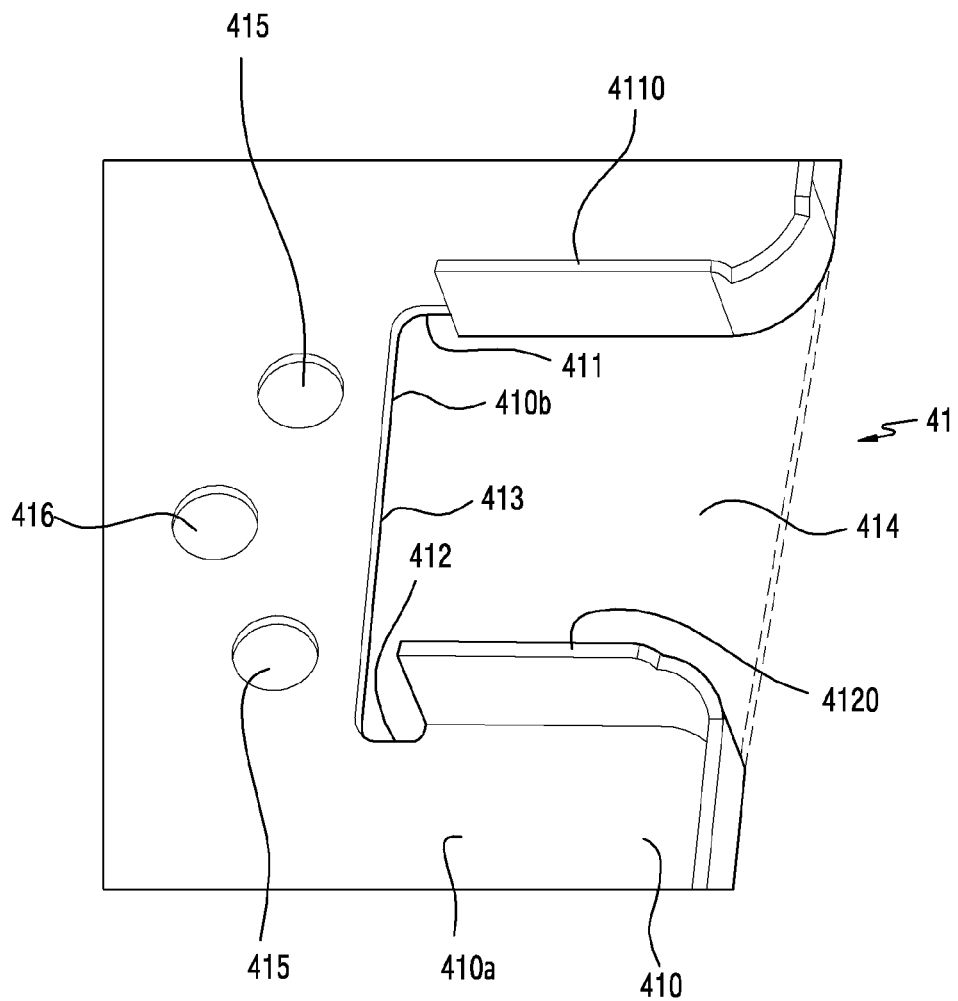
FIG. 4A is a perspective view illustrating a part of a first conductive plate according to various embodiments of the present disclosure.
Figure 4B:
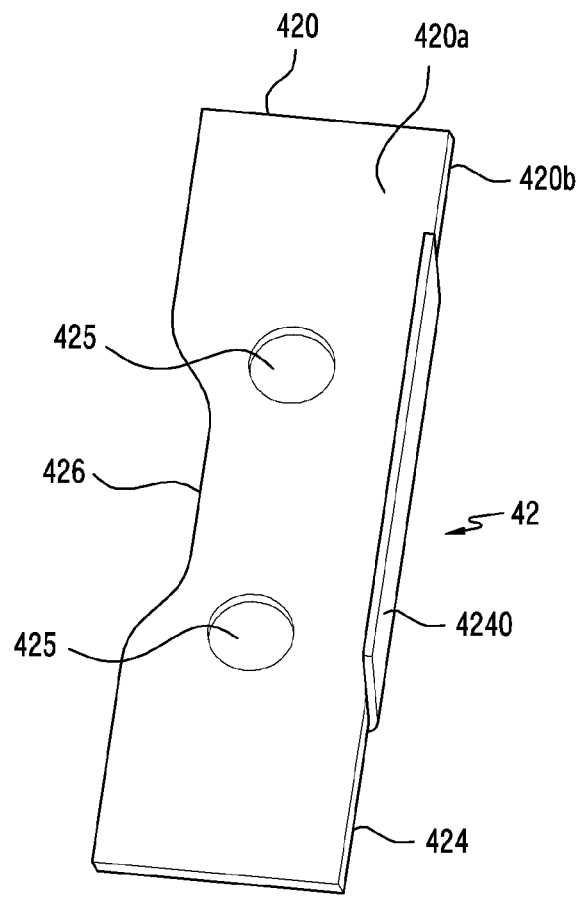
FIG. 4B is a perspective view illustrating a second conductive plate according to various embodiments of the present disclosure.

FIG. 4A is a perspective view illustrating a part of a first conductive plate according to various embodiments of the present disclosure. FIG. 4B is a perspective view illustrating a second conductive plate according to various embodiments of the present disclosure.

Referring to FIG. 4A and FIG. 4B, a conductive shield can structure according to various embodiments may be constructed in combination of a first conductive plate 41 and a second conductive plate 42.

The conductive shield can structure according to various embodiments may include the first conductive plate 41. The first conductive plate 41 according to various embodiments may include a first edge portion 411, a second edge portion 412 spaced apart from the first edge portion 411, and a third edge portion 413 extending between the first and second edge portions 411 and 412.

In top view of the first conductive plate 41 mounted on a printed circuit board of an electronic device, a recess 414 may be constructed by the first to third edge portions 411 and 413. The first conductive plate 41 according to various embodiments may include a first flat portion 410 parallel to the printed circuit board. The first flat portion 410 according to various embodiments may include a first face 410a facing in a first direction, and a second face 410b facing in a second direction opposite to the first direction.

The first flat portion 410 according to various embodiments may include first and second side portions 4110 and 4120. The first side portion 4110 may extend along the first edge portion 411, and may face in a direction substantially vertical to the first flat portion 410. The second side portion 4120 may extend along the second edge portion 412, and may face in a direction substantially vertical to the first flat portion 410. The first side portion 4110 may be bent from the first edge portion 411, and the second side portion 4120 may be bent from the second edge portion 412. The first side portion 4110 may be bent from the first flat portion 410, and the second side portion 4120 may be bent from the first flat portion 410. The first and side portions 4110 and 4120 may face in a state of being spaced apart from each other.

The first flat portion 410 according to various embodiments may include at least one first opening. The first opening according to various embodiments may include a first assembly guide opening 415 for guiding a bonding position when bonding processing is performed between the first and second conductive plates 41 and 42, and an assembly identifying opening 416 for identifying whether the second conductive plate 42 is assembled to the first conductive plate 41. For example, the first assembly guide opening 415 may be constructed of two openings, and the assembly identifying opening 416 may be constructed of one opening. The assembly identifying opening 416 may be located between the first assembly guide openings 415. Each of the first assembly guide opening 415 and the assembly identifying opening 416 may be constructed in a hole shape.

When the first and second conductive plates 41 and 42 according to various embodiments are bonded, at least a part 426 of the second conductive plate 42 blocks at least a part of the assembly identifying opening 416, thereby visually identifying whether the second conductive plate 42 is assembled. For example, spot welding may be used for the bonding of the first and second conductive plates 41 and 42. In addition, a laser may be used as a thermal source of the spot welding. A position of the spot welding may be an area between the first assembly guide opening 415 and an area around the first assembly guide opening 415.

The conductive shield can structure according to various embodiments may include the second conductive plate 42. The second conductive plate 42 according to various embodiments may include a fourth edge portion 424 extending substantially parallel to the third edge portion 413.

In top view of the second conductive plate 42 mounted on the printed circuit board, a second flat portion 420 attached to the first flat portion 410 while at least partially overlapping with the first flat portion 410 may be included. The second flat portion 420 according to various embodiments may include a first face 420a facing in a first direction and a second face 420b facing in a second direction opposite to the first direction.

The second flat portion 420 according to various embodiments may include a third side portion 4240. The third side portion 4240 may be bent from the fourth edge portion 424 while surrounding the third edge portion, and may face in a direction substantially vertical to the first flat portion 410. The third side portion 4240 may extend between the first and second side portions 4110 and 4120.

The second flat portion 420 according to various embodiments may include at least one second opening. The second opening according to various embodiments may include a second assembly guide opening 425 for guiding a bonding position when bonding processing is performed between the first and second conductive plates 41 and 42. In addition, the second flat portion 420 may include a part 426 capable of identifying whether the second conductive plate 42 is assembled. For example, the second assembly guide opening 425 may be constructed of two openings. Each of the second assembly guide openings 425 may be constructed in a hole shape.

Figure 4C:
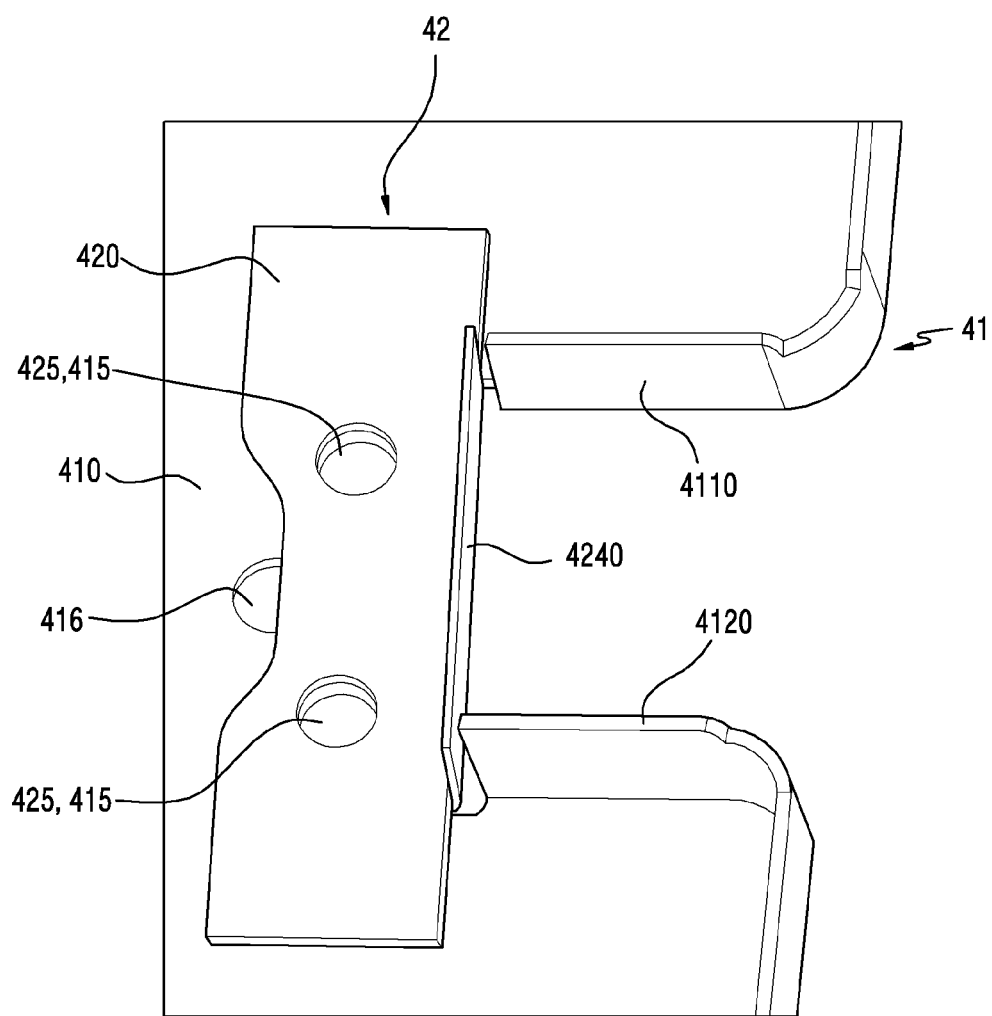
FIG. 4C is a perspective view illustrating an important part of a conductive shield can structure in which first and second conductive plates are bonded according to various embodiments of the present disclosure.
Figure 4D:
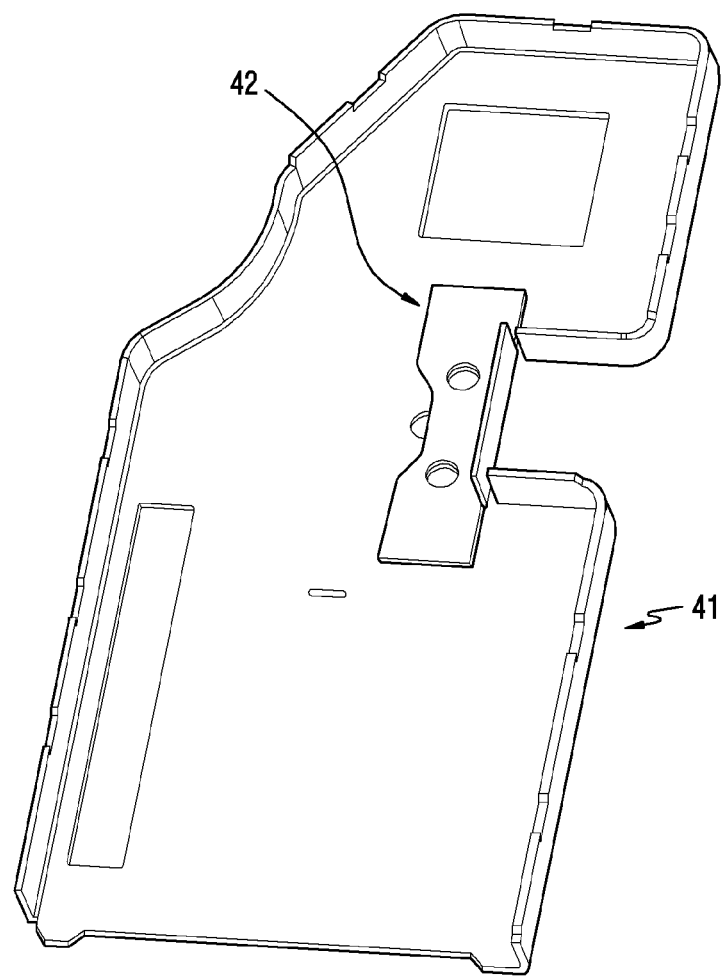
FIG. 4D is a perspective view illustrating the entirety of a conductive shield can structure in which first and second conductive plates are bonded according to various embodiments of the present disclosure.

FIG. 4C is a perspective view illustrating an important part of a conductive shield can structure in which first and second conductive plates are bonded according to various embodiments of the present disclosure. FIG. 4D is a perspective view illustrating the entirety of a conductive shield can structure in which first and second conductive plates are bonded according to various embodiments of the present disclosure.

Referring to FIG. 4C and FIG. 4D, when the second conductive plate 42 according to various embodiments is bonded to the first conductive plate 41, at least one first assembly guide opening 415 may be aligned with at least one second assembly guide opening 425.

In top view of the first conductive plate 41, the at least one assembly identifying opening 416 may be blocked by at least the part 426 of the second flat portion 420.

When the second conductive plate 42 according to various embodiments is bonded to the first conductive plate 41, the first flat portion 410 and the second flat portion 420 may be closely in contact, parallel to each other, and attached to each other. When the second conductive plate 42 according to various embodiments is bonded to the first conductive plate 41, at least a part of the first face 410a of the first flat portion 410 may be attached to at least a part of the second face 420b of the second flat portion 420, and may be parallel and attached to each other. The first face 410a of the first plate may be closely in contact with the second face 420b of the second plate. For example, the first and second flat portions 410 and 420 may be attached without an adhesive, or may be attached by using the adhesive (not shown).

In top view of the printed circuit board of the electronic device (e.g., the electronic device 100 of FIG. 1 and FIG. 2), the second edge portion 412 may extend substantially parallel to the first edge portion 411, and in top view of one face of the printed circuit board, the third edge portion 413 may extend between the first and second edge portions 411 and 412. In addition, the third edge portion 413 may extend in a direction substantially vertical to the first edge portion 411. A first corner portion constructed by the first side portion 4110 and the third side portion 4240 may have a substantially right angle shape, and a second corner portion constructed by the second side portion 4120 and the third side portion 4240 may have a substantially right angle shape.

The first and second conductive plates 41 and 42 according to various embodiments may be configured to have the same thickness or different thicknesses. In addition, the first and second side portions 4110 and 4120 and the third side portion 4240 may be configured to have the same thickness or different thicknesses.

Figure 5:
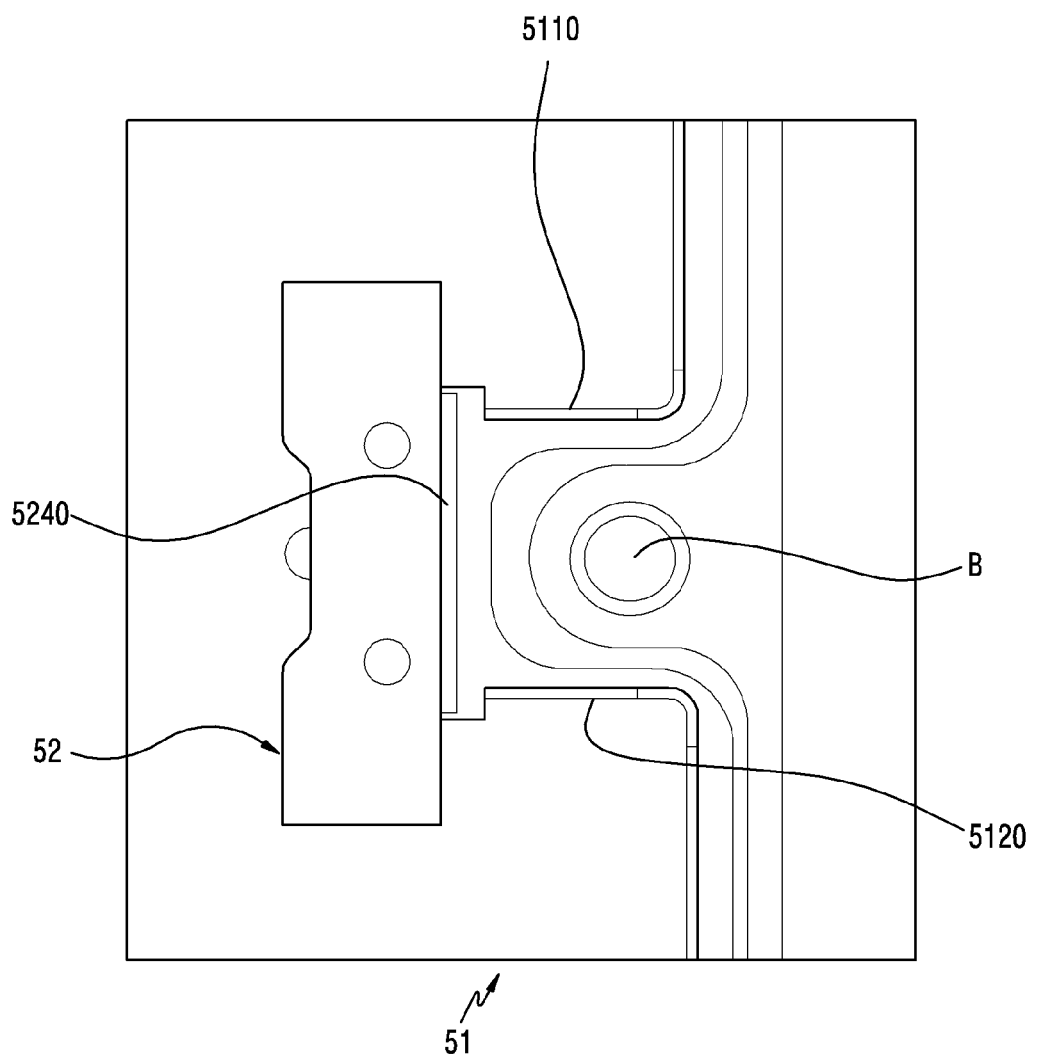
FIG. 5 is a plan view illustrating a state in which there is no loss of a component mounting space due to a part of a conductive plate constructed in a curved shape by avoiding a boss in a conductive shield can structure according to various embodiments of the present disclosure.

A state in which the conductive shield can structure constructed of the aforementioned bonding structure of the first and second conductive plates 41 and 42 is mounted on a printed circuit board is illustrated in FIG. 5.

FIG. 5 is a plan view illustrating a state in which there is no loss of a component mounting space due to a part of a conductive plate constructed in a curved shape by avoiding a boss in a conductive shield can structure according to various embodiments of the present disclosure.

Referring to FIG. 5, the conductive shield can structure according to various embodiments may utilize a substantially rectangular area in which first and second side portions 5110 and 5120 (e.g., the first and side portions 4110 and 4120 of FIG. 4A) and a third side portion 5240 (e.g., the third side portion 4240 of FIG. 4B) are vertically met each other, as a component mounting space. The conductive shield can structure according to various embodiments may remove an unnecessary space which is wasted around a boss of the electronic device, thereby increasing an area that can be shielded by a shield can, compared to the conventional case. For example, a boss B surrounded by the first to third side portions 5110, 5120, and 5140 may be located to be spaced apart by a specific distance from the first to third side portions 5110, 5120, and 5240.

Figure 6A:
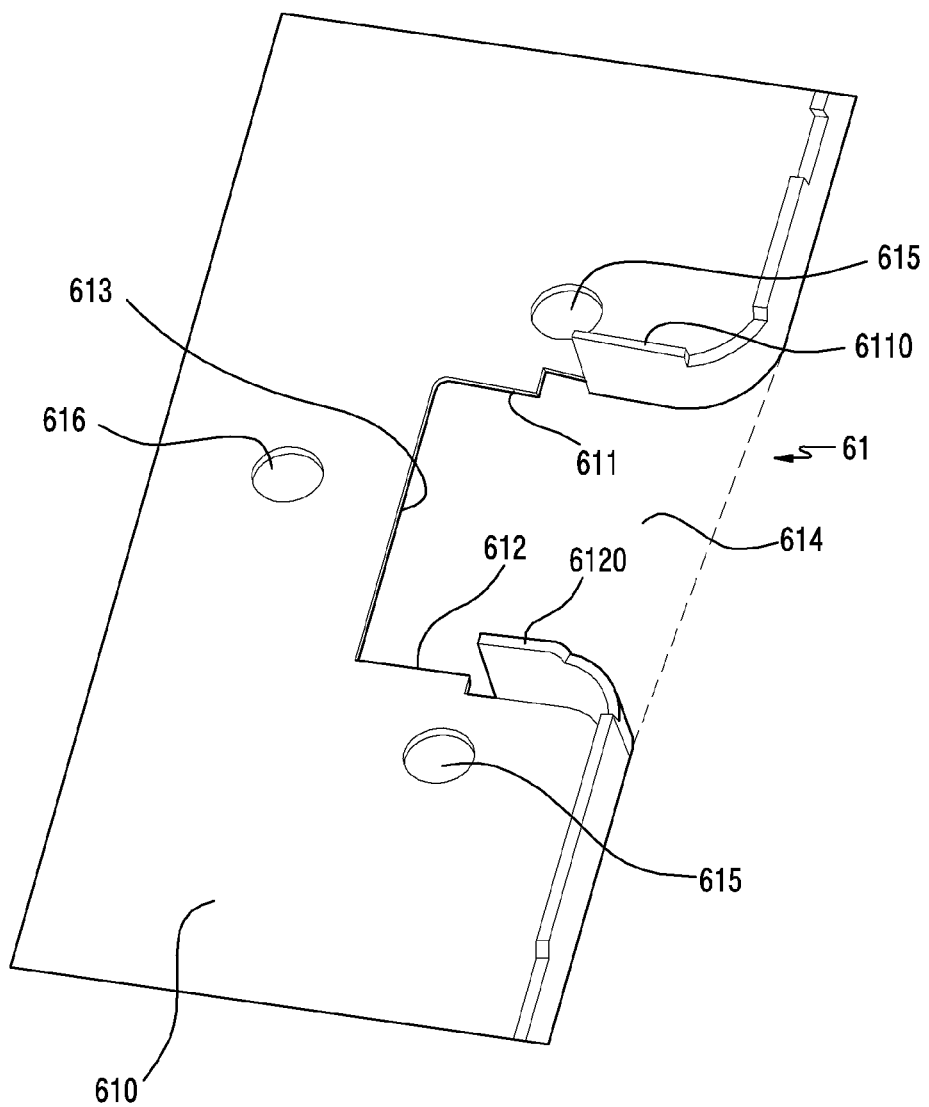
FIG. 6A is a perspective view illustrating a part of a first conductive plate according to various embodiments of the present disclosure.
Figure 6B:
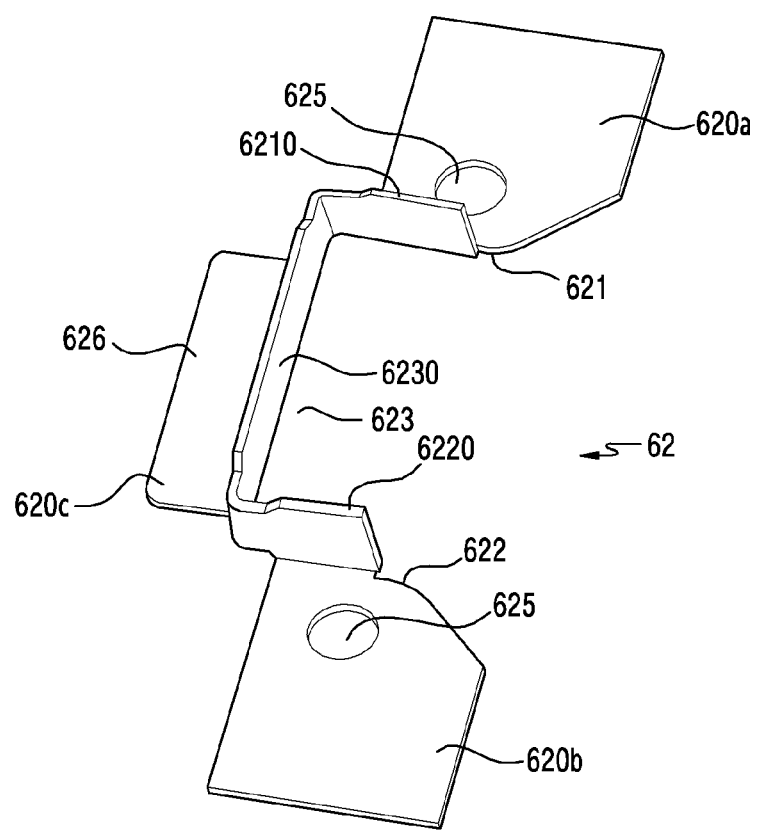
FIG. 6B is a perspective view illustrating a second conductive plate according to various embodiments of the present disclosure.

FIG. 6A is a perspective view illustrating a part of a first conductive plate according to various embodiments of the present disclosure. FIG. 6B is a perspective view illustrating a second conductive plate according to various embodiments of the present disclosure.

Referring to FIG. 6A and FIG. 6B, a conductive shield can structure according to various embodiments may include a first conductive plate 61 (e.g., the first conductive plate 41 of FIG. 4A). The first conductive plate 61 according to various embodiments may include a first edge portion 611 (e.g., the first edge portion 411 of FIG. 4A), a second edge portion 612 (e.g., the second edge portion 412 of FIG. 4A) spaced apart from the first edge portion 611, and a third edge portion 613 (e.g., the third edge portion 413 of FIG. 4A) extending between the first and second edge portions 611 and 612.

In top view of the first conductive plate 61 mounted on a printed circuit board of an electronic device (e.g., the electronic device 100 of FIG. 1 and FIG. 2), a recess 614 may be constructed by the first to third edge portions 611 and 613. The first conductive plate 61 according to various embodiments may include a first flat portion 610 (e.g., the first flat portion 410 of FIG. 4A) parallel to the printed circuit board.

The first flat portion 610 according to various embodiments may include first and second side portions 6110 and 6120. The first side portion 6110 may extend along the first edge portion 611, and may face in a direction substantially vertical to the first flat portion 610. The second side portion 6120 may extend along the second edge portion 612, and may face in a direction substantially vertical to the first flat portion 610. The first side portion 6110 may be bent from the first edge portion 611, and the second side portion 6120 may be bent from the second edge portion 612. A bending angle may be substantially about 90 degrees.

The first flat portion 610 according to various embodiments may include at least one first opening. The shield can structure according to various embodiments may include a first assembly guide opening 615 (e.g., the first assembly guide opening 415 of FIG. 4A) for guiding a bonding position when bonding processing is performed between the first and second conductive plates 61 and 62, and an assembly identifying opening 616 (e.g., the assembly identifying opening 416 of FIG. 4A) for identifying whether the second conductive plate 62 is assembled to the first conductive plate 61. For example, the first assembly guide opening 615 may be constructed of two openings, and the assembly identifying opening 616 may be constructed of one opening. The assembly identifying opening 616 may be located between the first assembly guide openings 615. Each of the first assembly guide opening 615 and the assembly identifying opening 616 may be constructed in a hole shape.

When the first and second conductive plates 61 and 62 according to various embodiments are bonded, at least a part 626 (e.g., the part 426 of FIG. 4B) of the second conductive plate 62 blocks at least a part of the assembly identifying opening 616, thereby visually identifying whether the second conductive plate 62 is assembled. For example, spot welding may be used for the bonding of the first and second conductive plates 61 and 62. In addition, a laser may be used as a thermal source of the spot welding. A position of the spot welding may be an area between the first assembly guide opening 615 and an area around the first assembly guide opening 615.

The conductive shield can structure according to various embodiments may include the second conductive plate 62 (e.g., the second conductive plate 42 of FIG. 4B). The second conductive plate 62 according to various embodiments may include a fourth edge portion 621 parallel to the first edge portion 611, a fifth edge portion 622 parallel to the second edge portion 612, and a sixth edge portion 623 parallel to the third edge portion 613.

In top view of the second conductive plate 62 mounted on the printed circuit board, second flat portions 620a, 620b, and 620c attached to the first flat portion 610 while at least partially overlapping with the first flat portion 610 may be included. The second flat portions 620a, 620b, and 620c may be constructed of at least one or two separated portions.

The second flat portions 620a, 620b, and 620c according to various embodiments may include third to fifth side portions 6210, 6220, and 6230. The third side portion 6210 may be bent from the fourth edge portion 621, and may face in a direction substantially vertical to the first flat portion 610. The fourth side portion 6210 may be bent from the fifth edge portion 622, and may face in a direction substantially vertical to the first flat portion 610. The fifth side portion 6230 may be bent from the sixth edge portion 623, and may face in a direction substantially vertical to the first flat portion 610.

The second flat portions 620a, 620b, and 620c according to various embodiments may include at least one second opening. The second opening according to various embodiments may include a second assembly guide opening 625 for guiding a bonding position when bonding processing is performed between the first and second conductive plates 61 and 62, and the part 626 capable of identifying whether the second conductive plate 62 is assembled. For example, the second assembly guide opening 625 may be constructed of two openings. Each of the second assembly guide openings 625 may be constructed in a hole shape.

Figure 6C:
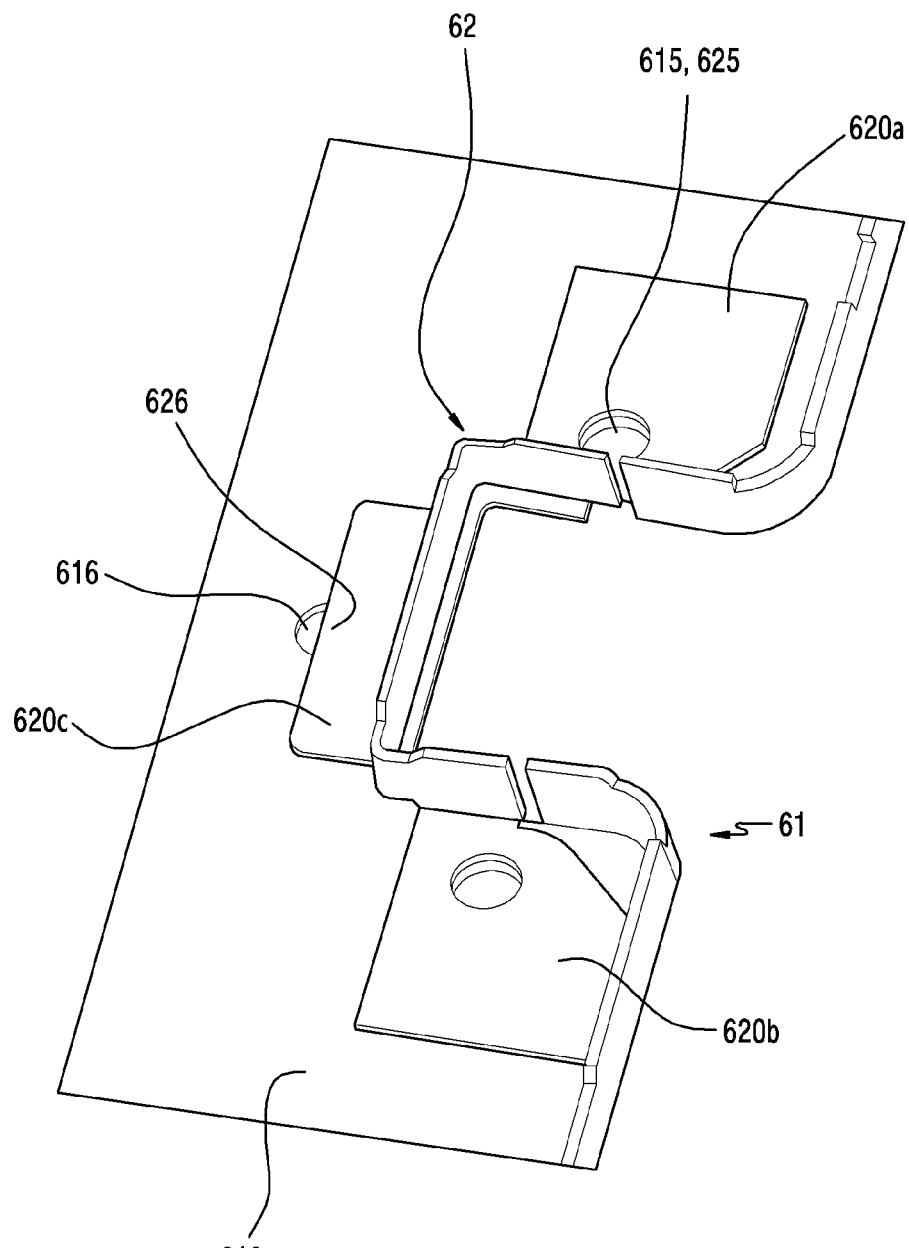
FIG. 6C is a perspective view illustrating an important part of a conductive shield can structure in which first and second conductive plates are bonded according to various embodiments of the present disclosure.

FIG. 6C is a perspective view illustrating an important part of a conductive shield can structure in which first and second conductive plates are bonded according to various embodiments of the present disclosure.

Referring to FIG. 6C, when the second conductive plate 62 according to various embodiments is bonded to the first conductive plate 61, at least one first assembly guide opening 615 may be aligned with at least one second assembly guide opening 625.

In top view of the first conductive plate 61, the at least one assembly identifying opening 616 may be blocked by at least the part 626 of the second flat portion 620c.

When the second conductive plate 62 according to various embodiments is bonded to the first conductive plate 61, the first flat portion 610 and the second flat portions 620a, 620b, and 620c may be closely in contact, parallel to each other, and attached to each other. When the second conductive plate 62 according to various embodiments is bonded to the first conductive plate 61, at least a part of the first flat portion 610 may be attached to at least a part of the second flat portions 620a, 620b, and 620c, and may be parallel and attached to each other.

Figure 7A:
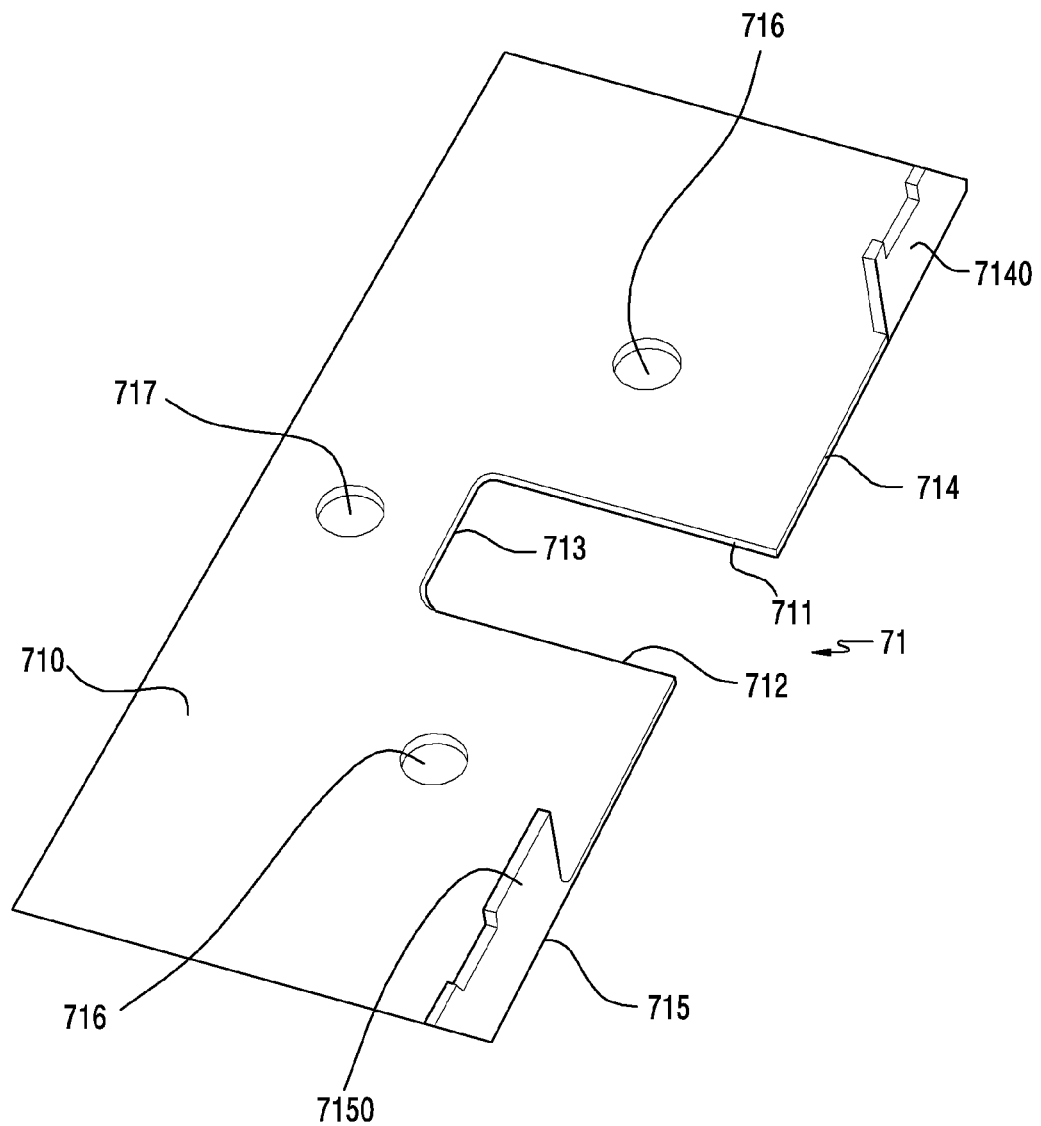
FIG. 7A is a perspective view illustrating a part of a first conductive plate according to various embodiments of the present disclosure.
Figure 7B:
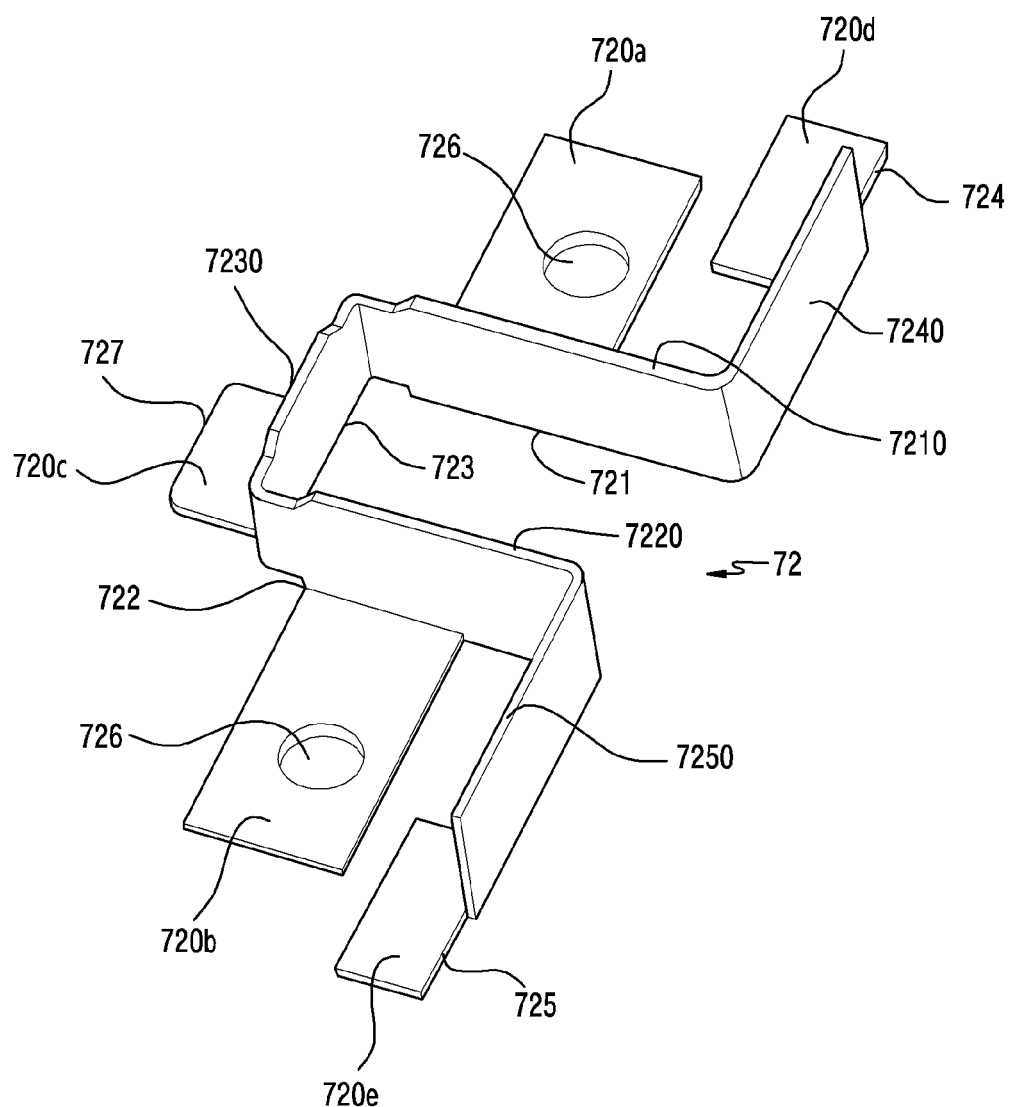
FIG. 7B is a perspective view illustrating a second conductive plate according to various embodiments of the present disclosure.

FIG. 7A is a perspective view illustrating a part of a first conductive plate according to various embodiments of the present disclosure. FIG. 7B is a perspective view illustrating a second conductive plate according to various embodiments of the present disclosure.

Referring to FIG. 7A and FIG. 7B, a conductive shield can structure according to various embodiments may include a first conductive plate 71 (e.g., the first conductive plate 61 of FIG. 6A). The first conductive plate 71 according to various embodiments may include a first edge portion 711, a second edge portion 712 spaced apart from the first edge portion 711, a third edge portion 713 extending between the first and second edge portions 711 and 712, a fourth edge portion 714 parallel to the third edge portion 713 and vertical to the first edge portion 711, and a fifth edge portion 715 parallel to the third edge portion 713 and vertical to the second edge portion 712.

The first conductive plate 71 according to various embodiments may include a first flat portion 710 (e.g., the first flat portion 610 of FIG. 6A) parallel to a printed circuit board.

The first flat portion 710 according to various embodiments may include first and second side portions 7140 and 7150. The first side portion 7140 may extend along the fourth edge portion 714, and may face in a direction substantially vertical to the first flat portion 710. The second side portion 7150 may extend along the fifth edge portion 715, and may face in a direction substantially vertical to the first flat portion 710. The first side portion 7140 may be bent from the fourth edge portion 714, and the second side portion 7150 may be bent from the fifth edge portion 715. A bending angle may be substantially about 90 degrees.

The first flat portion 710 according to various embodiments may include at least one first opening. The first opening according to various embodiments may include a first assembly guide opening 716 (e.g., the first assembly guide opening 616 of FIG. 6A) for guiding a bonding position when bonding processing is performed between the first and second conductive plates 71 and 72, and an assembly identifying opening 717 (e.g., the assembly identifying opening 616 of FIG. 6A) for identifying whether the second conductive plate 72 is assembled to the first conductive plate 71. For example, the first assembly guide opening 716 may be constructed of two openings, and the assembly identifying opening 717 may be constructed of one opening. The assembly identifying opening 717 may be located between the first assembly guide openings 716. Each of the first assembly guide opening 716 and the assembly identifying opening 717 may be constructed in a hole shape.

When the first and second conductive plates 71 and 72 according to various embodiments are bonded, at least a part 727 (e.g., the part 626 of FIG. 6A) of the second conductive plate 72 blocks at least a part of the assembly identifying opening 717, thereby visually identifying whether the second conductive plate 72 is assembled. For example, spot welding may be used for the bonding of the first and second conductive plates 71 and 72. In addition, a laser may be used as a thermal source of the spot welding. A position of the spot welding may be an area between the first assembly guide opening 716 and an area around the first assembly guide opening 716.

The conductive shield can structure according to various embodiments may include a second conductive plate 72 (e.g., the second conductive plate 62 of FIG. 6B). The second conductive plate 72 according to various embodiments may include a sixth edge portion 721 parallel to the first edge portion 711, a seventh edge portion 722 parallel to the second edge portion 712, an eighth edge portion 723 parallel to the third edge portion 713, a ninth edge portion 724 parallel to the fourth edge portion 714, and a tenth edge portion 725 parallel to the fifth edge portion 715.

In top view of the second conductive plate 72 mounted on the printed circuit board, second flat portions 720a to 720e attached to the first flat portion 710 while at least partially overlapping with the first flat portion 710 may be included. The second flat portions 720a to 720e may be constructed of at least one or two separated portions.

The second flat portions 720a to 720e according to various embodiments may include third to seventh side portions 7210, 7220, 7230, 7240, and 7250.

The third side portion 7210 may be bent from the sixth edge portion 721, and may face in a direction substantially vertical to the first flat portion 710. The fourth side portion 7220 may be bent from the seventh edge portion 722, and may face in a direction substantially vertical to the first flat portion 710. The fifth side portion 7230 may be bent from the eighth edge portion 723, and may face in a direction substantially vertical to the first flat portion 710. The sixth side portion 7240 may be bent from the ninth edge portion 724, and may face in a direction substantially vertical to the first flat portion 710. The seventh side portion 7250 may be bent from the tenth edge portion 725, and may face in a direction substantially vertical to the first flat portion 710.

The second flat portions 720a to 720e according to various embodiments may include at least one opening and a part of a second flat portion for blocking one opening. The shield can structure according to various embodiments may include a second assembly guide opening 726 for guiding a bonding position when bonding processing is performed between the first and second conductive plates 61 and 62, and the part 727 capable of identifying whether the second conductive plate 62 is assembled. For example, the second assembly guide opening 726 may be constructed of two openings. Each of the second assembly guide openings 726 may be constructed in a hole shape.

Figure 7C:
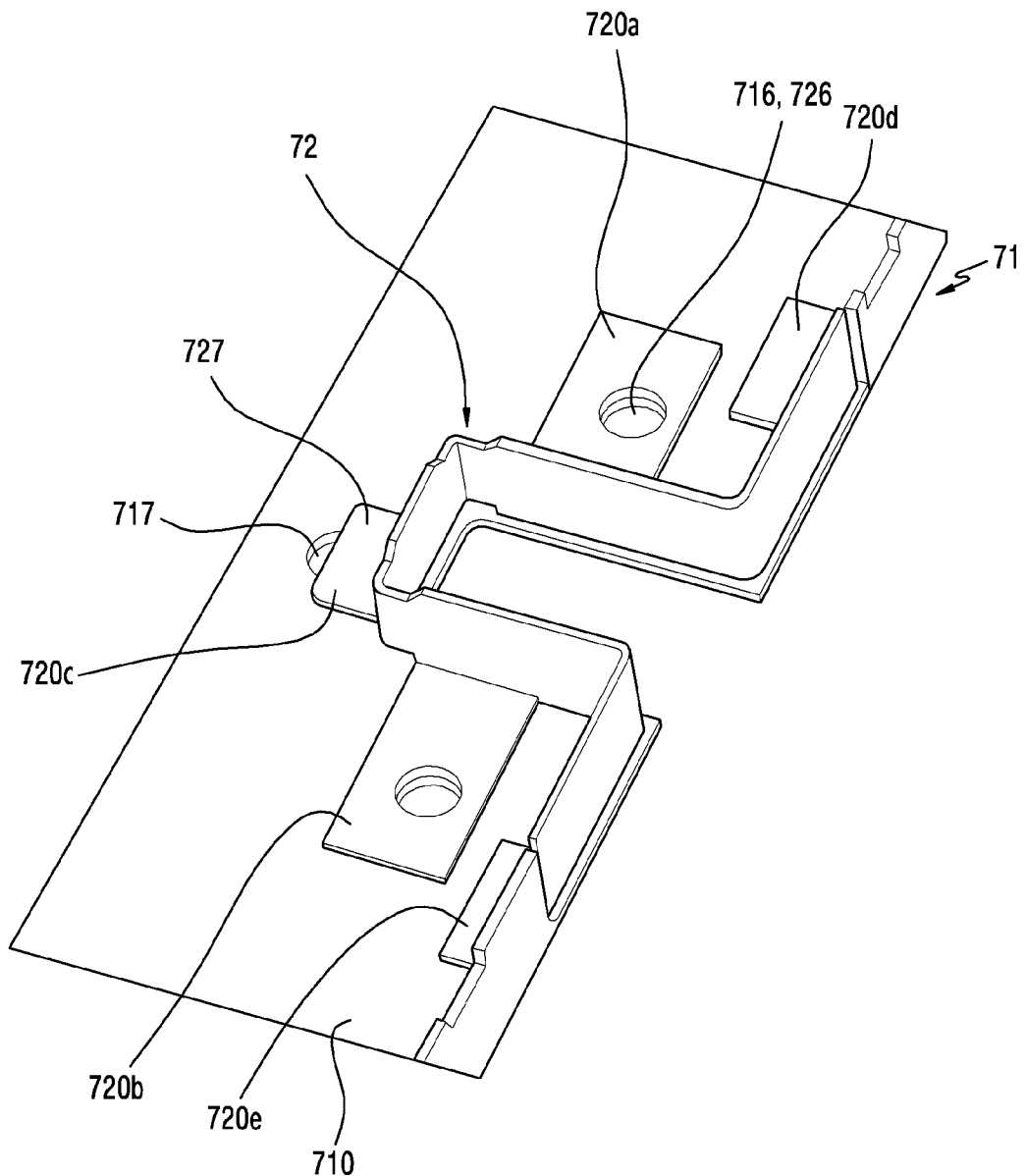
FIG. 7C is a perspective view illustrating an important part of a conductive shield can structure in which first and second conductive plates are bonded according to various embodiments of the present disclosure.

FIG. 7C is a perspective view illustrating an important part of a conductive shield can structure in which first and second conductive plates are bonded according to various embodiments of the present disclosure.

Referring to FIG. 7C, when the second conductive plate 72 according to various embodiments is bonded to the first conductive plate 71, at least one first assembly guide opening 716 may be aligned with at least one second assembly guide opening 726.

In top view of the first conductive plate 71, the at least one first assembly identifying opening 716 may be blocked by at least the part 727 of the second flat portion 720.

When the second conductive plate 72 according to various embodiments is bonded to the first conductive plate 71, the first flat portion 710 and the second flat portions 720a to 7203 may be closely in contact, parallel to each other, and attached to each other. When the second conductive plate 72 according to various embodiments is bonded to the first conductive plate 71, at least a part of the first flat portion 710 may be attached to at least a part of the second flat portions 720a to 720e, and may be parallel and attached to each other.

Figure 7D:
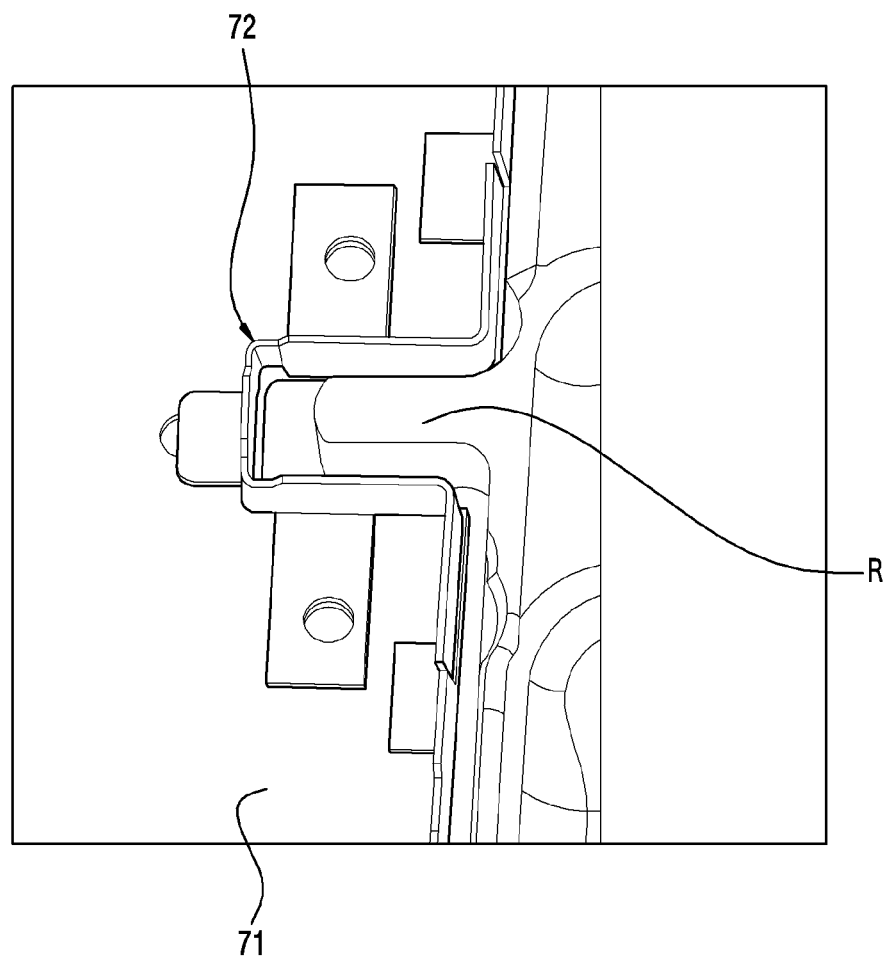
FIG. 7D is a plan view illustrating a state in which there is no loss of a component mounting space due to a part of a conductive plate constructed in a curved shape by avoiding a rib in a conductive shield can structure according to various embodiments of the present disclosure.

FIG. 7D is a plan view illustrating a state in which there is no loss of a component mounting space due to a part of a conductive plate constructed in a curved shape by avoiding a rib in a conductive shield can structure according to various embodiments of the present disclosure.

Referring to FIG. 7D, in the conductive shield can structure constructed by bonding the first and second conductive plates 71 and 72 of FIG. 7C, when disposed to a place in contact with a rib R of a support construction included in an electronic device, it may be possible that the conductive shield can structure is disposed without a loss of a component mounting space by avoiding the rib R having a narrower width than a boss.

Figure 8A:
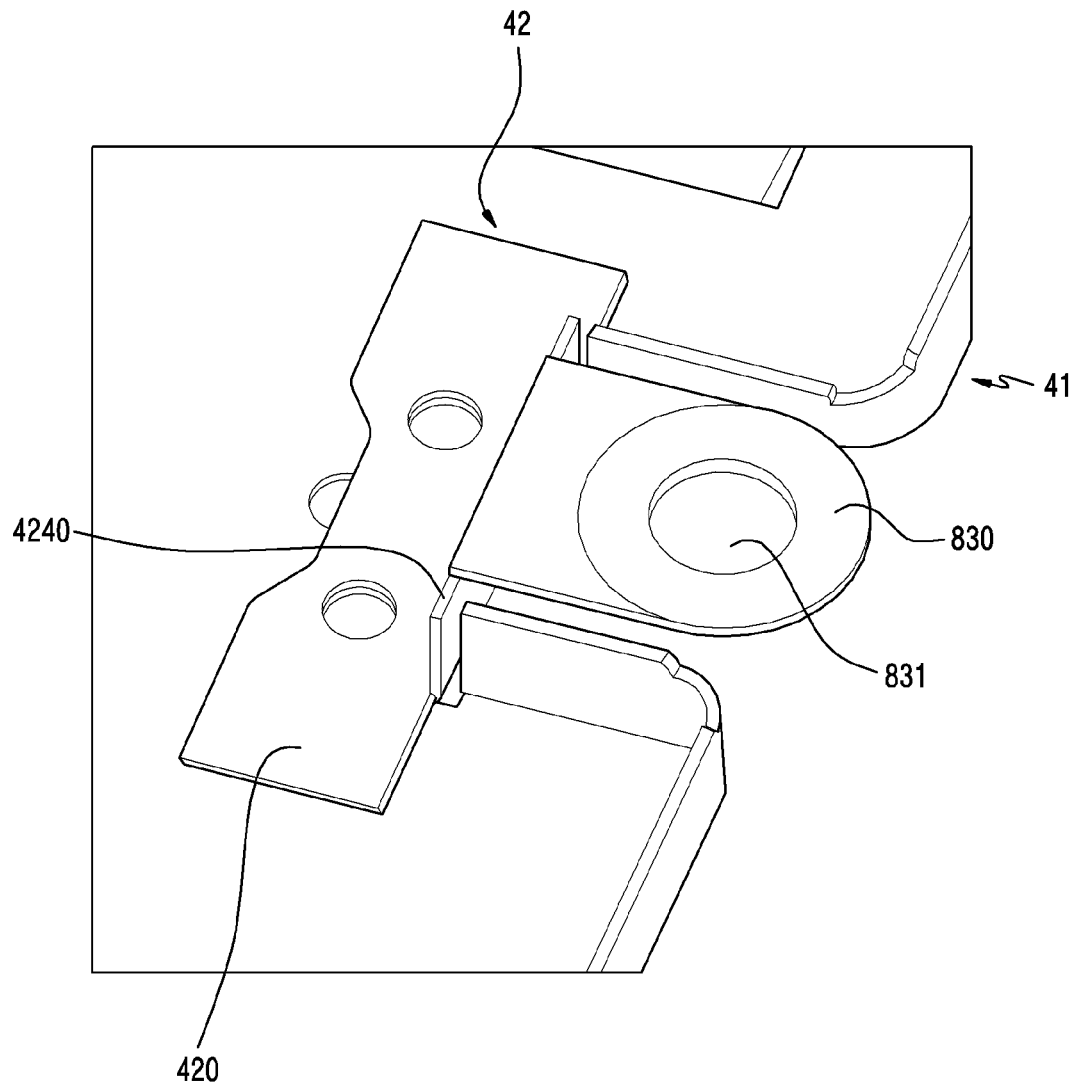
FIG. 8A is a perspective view illustrating a conductive shield can structure in which first and second conductive plates are bonded according to various embodiments of the present disclosure.

FIG. 8A is a perspective view illustrating a conductive shield can structure in which first and second conductive plates are bonded according to various embodiments of the present disclosure.

Referring to FIG. 8A, in the description of the conductive shield can structure according to various embodiments, the same configuration as the conductive shield can structure of FIG. 4A to FIG. 4C will be omitted to avoid redundancy, and only differences will be described.

In the conductive shield can structure according to various embodiments, the second conductive plate 42 may further include a conductive fastening portion 830. The conductive fastening portion 830 may be parallel to the second flat portion 420 of the second conductive plate 42, and may be bent from the third side portion 4240 of the second conductive plate 42. A bending angle of the conductive fastening portion 830 may be substantially about 90 degrees. The conductive fastening portion 830 may further include a fastening opening 831, and the fastening opening 831 may be constructed in a hole shape. The conductive shield can structure bonded to a boss B by the conductive fastening portion 830 is illustrated in FIG. 8B.

Figure 8B:
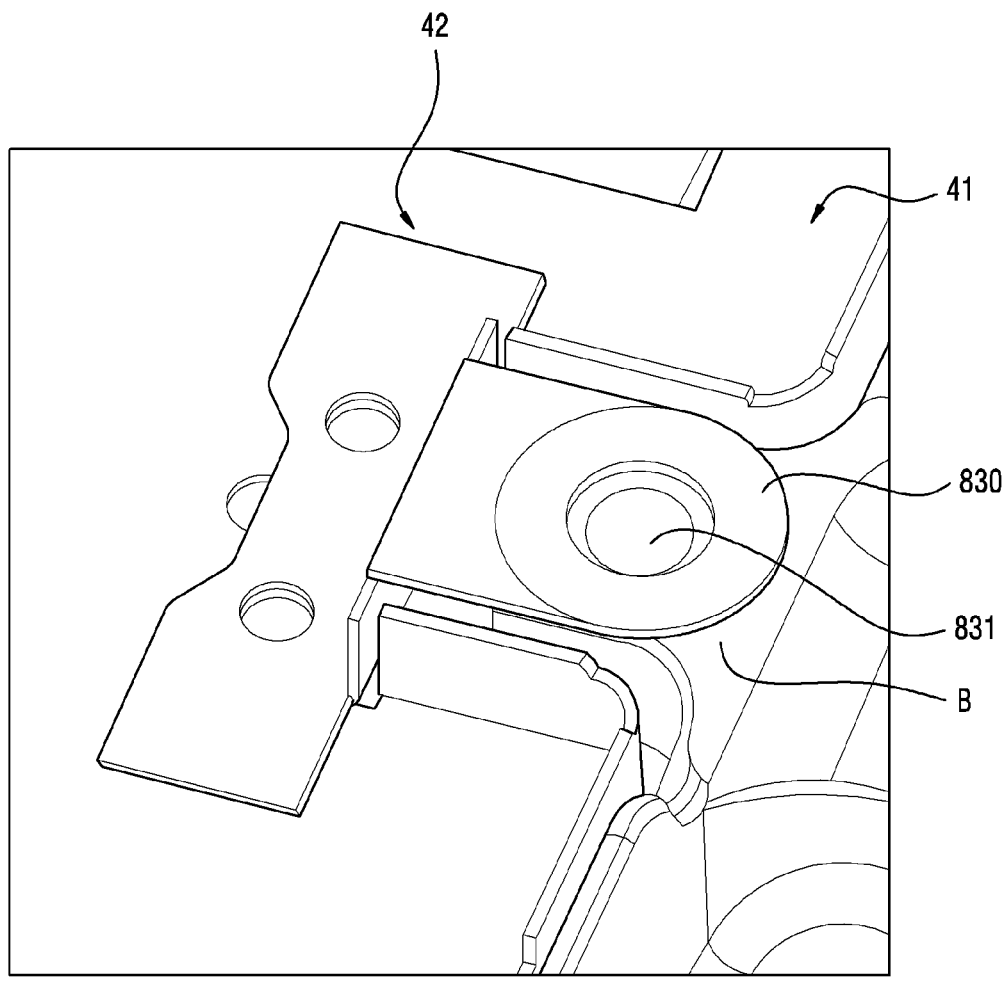
FIG. 8B is a perspective view illustrating a state in which a conductive fastening portion provided in a second conductive plate is aligned with a boss according to various embodiments of the present disclosure.

FIG. 8B is a perspective view illustrating a state in which a conductive fastening portion provided in a second conductive plate is aligned with a boss according to various embodiments of the present disclosure.

Referring to FIG. 8B, the fastening opening 831 of the conductive fastening portion 830 may be fastened by a fastener (e.g., a screw) (not shown) in a state of being aligned with a fastening opening of a boss B. The conductive fastening portion 830 may be used to fasten the conductive shield can structure to the boss B, thereby enhancing bonding strength of a bonding structure of the first and second conductive plates 41 and 42.

Figure 9:
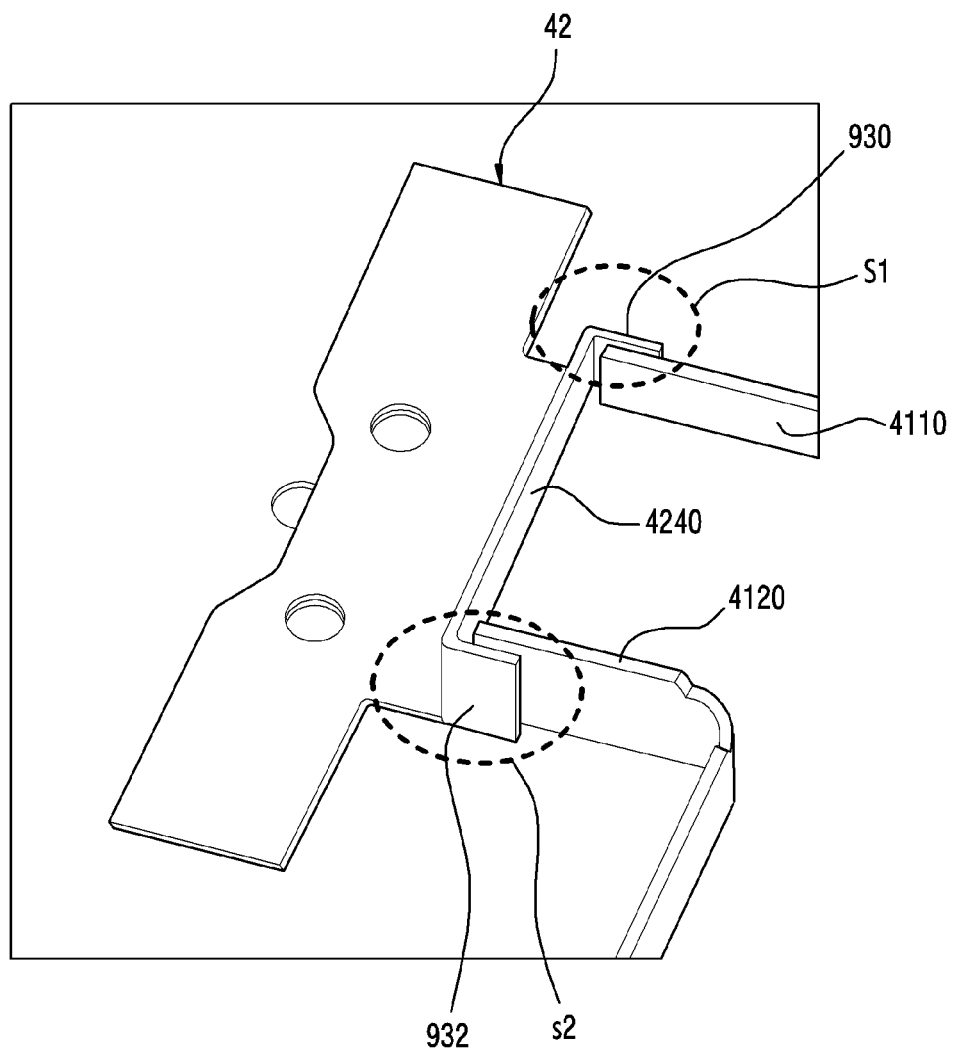
FIG. 9 is a perspective view illustrating a conductive shield can structure in which first and second conductive plates are bonded according to various embodiments of the present disclosure.

FIG. 9 is a perspective view illustrating a conductive shield can structure in which first and second conductive plates are bonded according to various embodiments of the present disclosure.

Referring to FIG. 9, in the description of the conductive shield can structure according to various embodiments, the same configuration as the conductive shield can structure of FIG. 4A to FIG. 4C will be omitted to avoid redundancy, and only differences will be described.

In the conductive shield can structure according to various embodiments, the second conductive plate 42 may further include first and second auxiliary side portions 930 and 932. The first auxiliary side portion 930 may be bent vertically from one end of the third side portion 4240. The first auxiliary side portion 930 according to various embodiments may be disposed to at least partially overlap with the first side portion 4110. A noise shielding effect may be improved according to an overlapping structure s1 of the conductive shield can.

The second auxiliary side portion 932 according to various embodiments may be bent vertically from the other end of the third side portion 4240, and thus may be disposed parallel to the second side portion 4120. The second auxiliary side portion 932 may be disposed to at least partially overlap with the second side portion 4120. A noise shielding effect may be improved according to an overlapping structure s2 of the conductive shield can.

Figure 10:
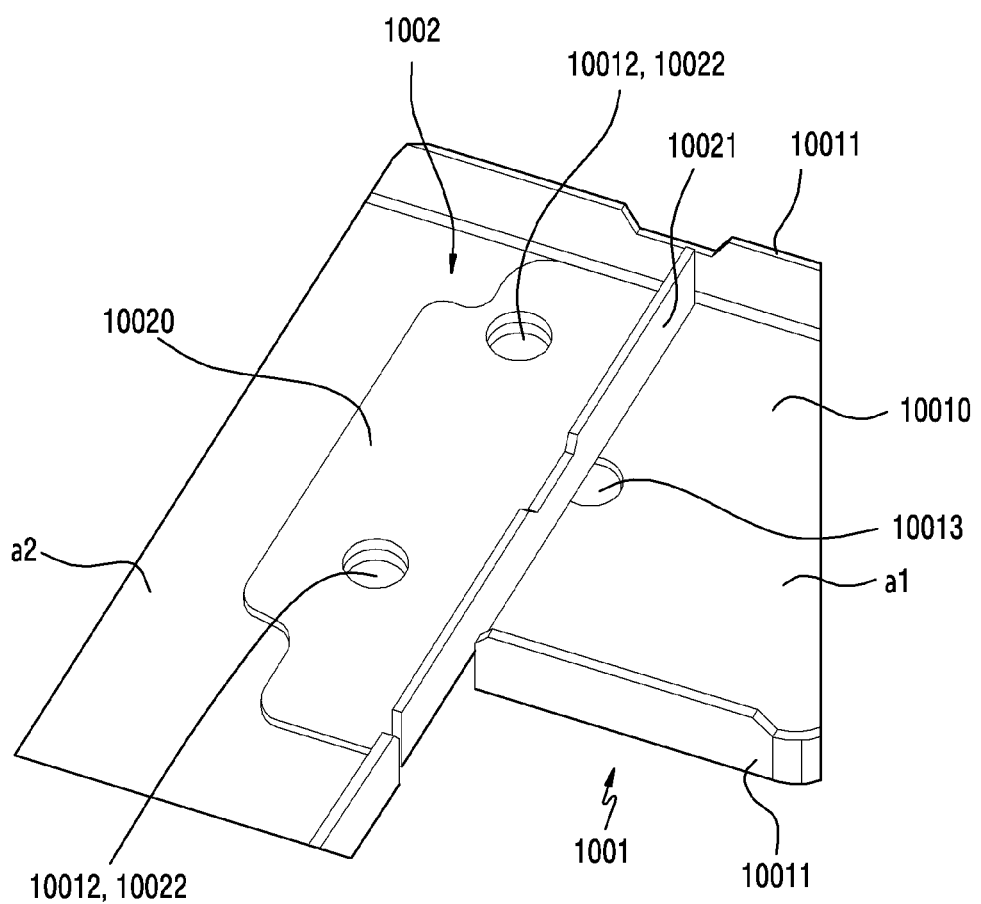
FIG. 10 is a perspective view illustrating a conductive shield can structure in which a shielding area is spatially divided by bonding first and second conductive plates according to various embodiments of the present disclosure.

FIG. 10 is a perspective view illustrating a conductive shield can structure in which a shielding area is spatially divided by bonding first and second conductive plates according to various embodiments of the present disclosure.

Referring to FIG. 10, the conductive shield can structure according to various embodiments may include a first conductive plate 1001 and a second conductive plate 1002 dividing a shielding area of the first conductive plate 1001 and bonded to the first conductive plate 1001.

The conductive shield can structure according to various embodiments may be constructed of two conductive plates to divide a shielding area at a corner portion of the shield can structure, thereby minimizing a loss of a component mounting space.

The first conductive plate 1001 according to various embodiments may include a first flat portion 10010. The first flat portion 10010 may include at least one or more first openings 10012 and 10013 and at least one first side portion 10011. The first conductive plate 1001 may include a first shielding area a1 and a second shielding area a2 in contact with the first shielding area a1 due to the second conductive plate 1002. For example, a first opening may include at least one first assembly guide opening 10012 and a first assembly identifying opening 10013.

The second conductive plate 1002 according to various embodiments may include a second flat portion 10020. The second flat portion 10020 may include at least one second opening 10022 and at least one second side portion 10021. The second conductive plate 1002 may divide the first conductive plate 1001 into a first shielding area a1 and a second shielding area a2 in contact with the first shielding area a1. For example, the second opening 10022 may include second assembly guide openings 10022.

The second conductive plate 1002 according to various embodiments may include the second side portion 10021 bent vertically from the second flat portion 10020. The second side portion 10021 may face in a direction parallel or vertical to the first side portion 10011.

When the second conductive plate 1002 according to various embodiments is bonded to the first conductive plate 1001, at least one first assembly guide opening 10012 may be aligned with at least one second assembly guide opening 10022. In top view of the first conductive plate 1001, the at least one first assembly identifying opening 10013 may be blocked by at least a part of the second flat portion 10020 to identify an assembly state of the second conductive plate.

Figure 11A:
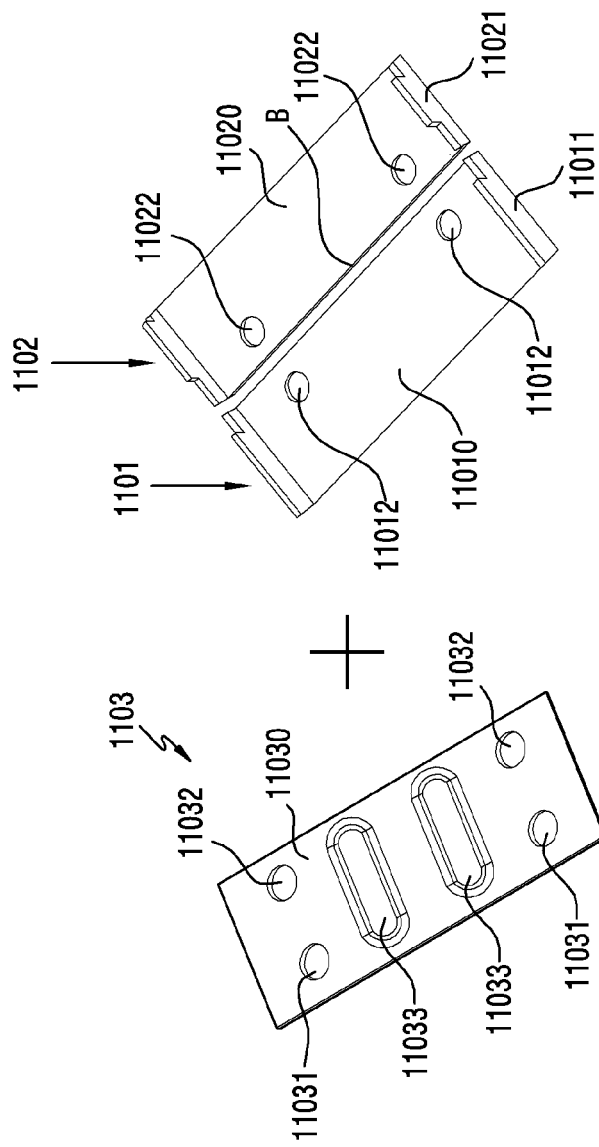
FIG. 11A is a perspective view illustrating first and second conductive plates and a conductive connection plate according to various embodiments of the present disclosure.
Figure 11B:
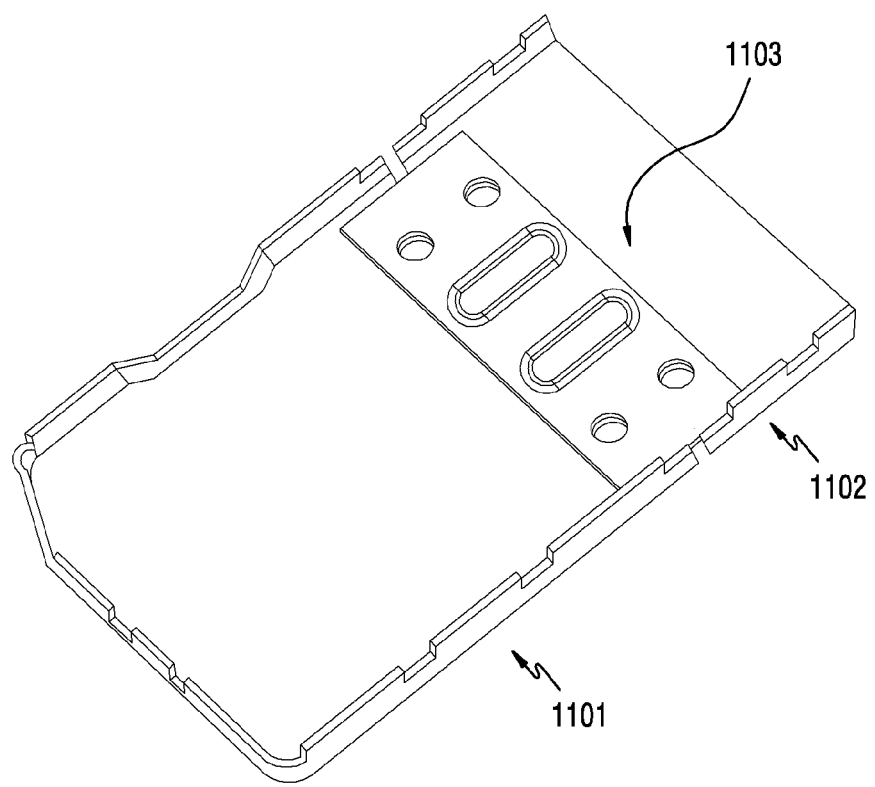
FIG. 11B is a perspective view illustrating a conductive shield can structure in which first and second conductive plates are bonded by a conductive connection plate according to various embodiments of the present disclosure.

FIG. 11A is a perspective view illustrating first and second conductive plates and a conductive connection plate according to various embodiments of the present disclosure. FIG. 11B is a perspective view illustrating a conductive shield can structure in which first and second conductive plates are bonded by a conductive connection plate according to various embodiments of the present disclosure.

Referring to FIG. 11A and FIG. 11B, the conductive shield can structure according to various embodiments may include first and second conductive plate 1101 and 1102 and a conductive connection plate 1103 for coupling the first and second conductive plate 1101 and 1002.

In the first conductive plate 1101 according to various embodiments, a side portion facing the second conductive plate 1102 may be removed among first side portions 11011 constructed along an edge portion of the first flat portion 11010. The first flat portion 11010 may include at least one first opening 11012. For example, the first opening 11012 may be constructed such that two assembly guide openings are spaced apart from each other, as a first assembly guide opening (e.g., the assembly guide opening 415 of FIG. 4A).

In addition, in the second conductive plate 1102 according to various embodiments, a side portion facing the first conductive plate 1101 may be removed among second side portions 11021 constructed along an edge of the second flat portion 11020. The second flat portion 11020 may include at least one second opening 11022. For example, the second opening 11022 may be constructed such that two assembly guide openings are spaced apart from each other, as a second assembly guide opening (e.g., the assembly guide opening 415 of FIG. 4A).

The conductive connection plate 1103 according to various embodiments may include a flat portion 11030, third openings 11031 and 11032 constructed at the flat portion 11030, and at least one or more protrusions 11033. The third openings 11031 and 11032 may be constructed of a plurality of third assembly guide openings. The third assembly guide openings may include the third assembly guide opening 11031 aligned with the first assembly guide opening 11012 of the first conductive plate 1101 and the third assembly guide opening 11032 aligned with the second assembly guide opening 11022 of the second conductive plate 1102.

The at least one or more protrusions 11033 according to various embodiments may extend in a direction traversing a boundary portion in which the first and second conductive plates 1101 and 1102 are met, as a structure reinforcement protrusion constructed for rigidity of the flat portion 11030. The at least one or more protrusions 11033 may be constructed between the third assembly guide openings 11031 and 11032. For example, the at least one or more protrusions 11033 may be constructed in pair at the flat portion 11030.

After the first and second conductive plates 1101 and 1102 are disposed to be close with each other, the conductive connection plate 1103 may be disposed to a position where an assembly guide opening is aligned, and thereafter the first and second conductive plates 1101 and 1102 may be coupled so as to physically overlap with the first and second conductive plates 1101 and 1102. For example, spot welding may be used for the bonding of the first and second conductive plates 1101 and 1102. In addition, a laser may be used as a thermal source of the spot welding.

Figure 12:
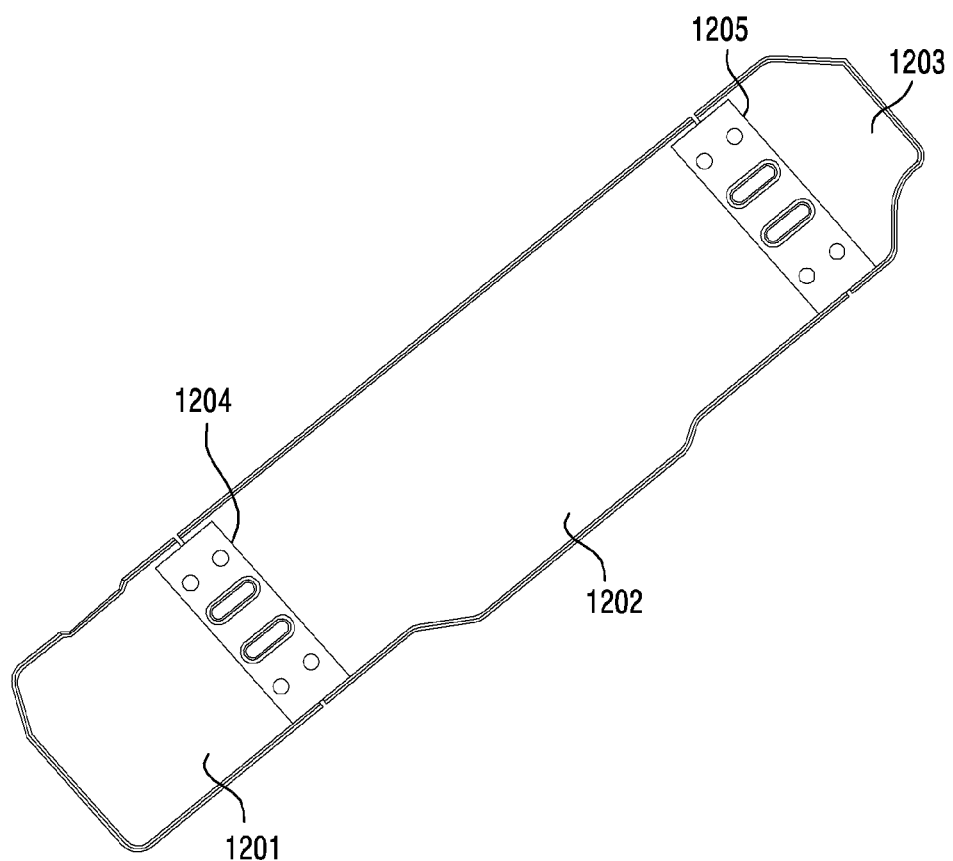
FIG. 12 is a perspective view illustrating a conductive shield can structure in which first to third conductive plates are bonded by first and second conductive connection plates according to various embodiments of the present disclosure.

FIG. 12 is a perspective view illustrating a conductive shield can structure in which first to third conductive plates are bonded by first and second conductive connection plates according to various embodiments of the present disclosure.

Referring to FIG. 12, the conductive shield can structure according to various embodiments may use first and second connection plates 1204 and 1205 to couple first to third conductive plates 1201 to 1203. The first conductive connection plate 1204 may be used to couple the first and second conductive plates 1201 and 1202. The second conductive connection plate 1205 may be used to couple the second and third conductive plates 1202 and 1203. A coupling method may use the coupling structure of FIG. 11A and FIG. 11B.

Figure 13:
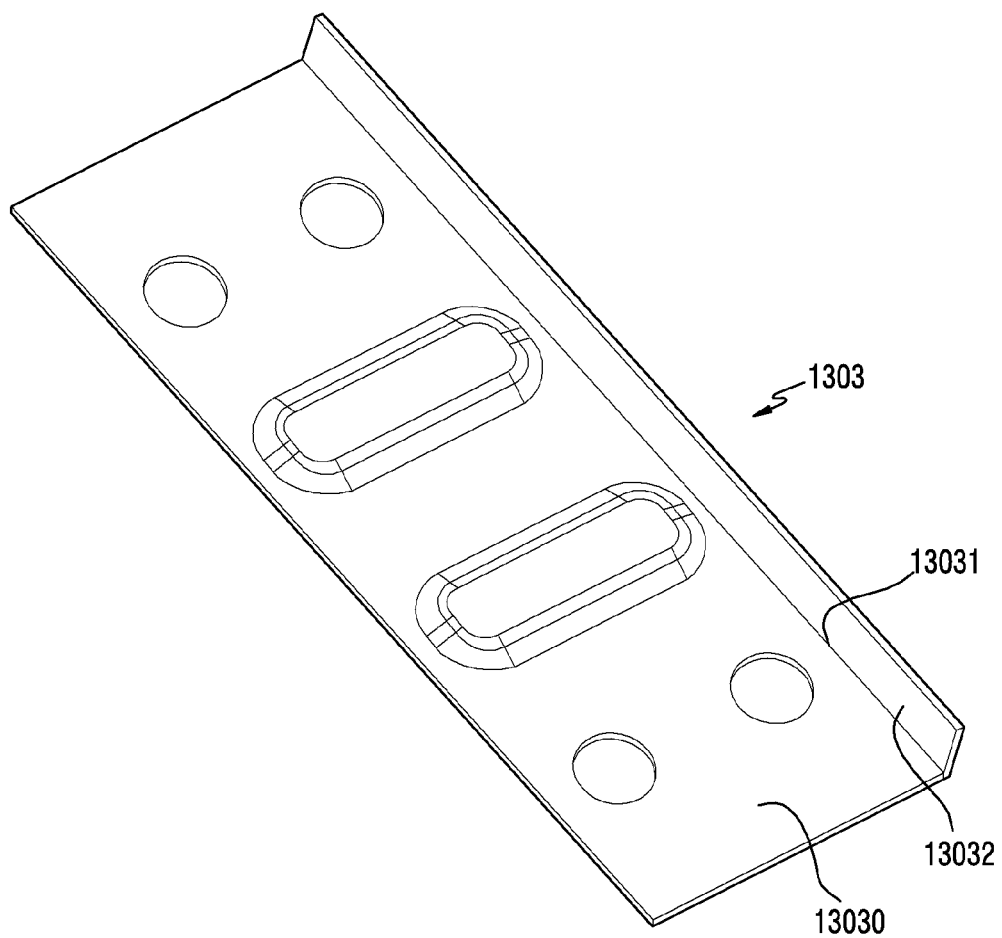
FIG. 13 is a perspective view illustrating a conductive connection plate capable of spatially dividing a shielding area according to various embodiments of the present disclosure.

FIG. 13 is a perspective view illustrating a conductive connection plate capable of spatially dividing a shielding area according to various embodiments of the present disclosure.

Referring to FIG. 13, in the description of the conductive shield can structure according to various embodiments, the same configuration as the conductive shield can structure of FIG. 11A will be omitted to avoid redundancy, and only differences will be described.

A conductive connection plate 1303 according to various embodiments may include a flat portion 13030 and a side portion 13032 bent from the flat portion 13030. The flat portion 13030 may include an edge portion 13031, and the side portion 13032 may extend vertically from the edge portion 1301. For example, the side portion 13032 may be constructed in a shape of a vertical wall in the flat portion 13030. In the conductive connection plate 1303, a shielding area of the conductive plate may be spatially divided by the side portion 13032. For example, when the first and second conductive plates (e.g., the first and second conductive plates 1101 and 1102 of FIG. 11A) are coupled by the conductive connection plate 1303, the shielding area of the first and second conductive plates may be spatially divided.

Various embodiments of the present disclosure disclosed in the present specification and the drawing are merely a specific example presented for clarity and are not intended to limit the scope of the embodiments of the present disclosure. Therefore, in addition to the embodiments disclosed herein, various changes in forms and details made without departing from the technical concept of the various embodiments of the present disclosure will be construed as being included in the scope of the various embodiments of the present disclosure.

The invention claimed is:
1. An electronic device comprising:
a printed circuit board comprising one face;
at least one electronic component mounted on the printed circuit board; and
a conductive shield can structure attached to the one face of the printed circuit board while surrounding the at least one electronic component,
wherein the conductive shield can structure comprises:

a first conductive plate comprising a first edge portion, a second edge portion spaced apart from the first edge portion, and a third edge portion extending between the first and second edge portions, and in top view of the one face of the printed circuit board, comprising a first flat portion parallel to the printed circuit board and constructing a recess together with the first to third edge portions;

a second conductive plate comprising a fourth edge portion extending substantially parallel to the third edge portion, and in top view of the one face of the printed circuit board, comprising a second flat portion to be attached to the first flat portion while at least partially overlapping the first flat portion;

a first side portion extending along the first edge portion and substantially vertical to the first flat portion;

a second side portion extending along the second edge portion and substantially vertical to the first flat portion; and a third side portion bent from the fourth edge portion while surrounding the third edge portion, and substantially vertical to the first flat portion.

2. The electronic device of claim 1, wherein one face of the first flat portion and one face of the second flat portion are attached to each other without an adhesive.

3. The electronic device of claim 2, wherein at least a part of the one face of the first flat portion is modified to be attached to at least a part of the one face of the second flat portion.

4. The electronic device of claim 3, wherein at least the part of the one face of the second flat portion is modified to be attached to at least the part of the one face of the first flat portion.

5. The electronic device of claim 1, wherein the first flat portion comprises at least one first opening, and the second flat portion comprises at least one second opening.

6. The electronic device of claim 5, wherein in top view of the first flat portion, the at least one first opening is aligned at least in part with the at least one second opening.

7. The electronic device of claim 5, wherein in top view of the first flat portion, a part of the at least one first opening is blocked at least in part by the second flat portion.

8. The electronic device of claim 1, wherein in top view of the one face of the printed circuit board, the second edge portion extends substantially parallel to the first edge portion, and in top view of the one face of the printed circuit board, the third edge portion extends between the first and second edge portions.

9. The electronic device of claim 8, wherein in top view of the one face of the printed circuit board, the third edge portion extends in a direction substantially vertical to the first edge portion.

10. The electronic device of claim 1, wherein the first side portion is bent from the first edge portion.

11. The electronic device of claim 10, wherein the second side portion is bent from the second edge portion.

12. The electronic device of claim 1, wherein at least one of the first side portion and the second side portion is bent from the second conductive plate.

13. An electronic device comprising:
a printed circuit board;
a first conductive plate comprising a first flat portion parallel to the printed circuit board;
a second conductive plate, in top view of one face of the printed circuit board, comprising a second flat portion to be attached to the first flat portion while at least partially overlapping the first flat portion;
a first side portion bent vertically from the first flat portion;
a second side portion facing the first side portion in a state of being spaced apart, and bent vertically from the first flat portion;
a third side portion bent vertically from the second flat portion and extending between the first and second side portions; and
a fastening structure surrounded by a substantially equal distance from each of the first to third side portions.

14. The electronic device of claim 13,
wherein a first corner portion produced by the first side portion and the third side portion has a right angle shape, and
wherein a second corner portion produced by the second side portion and the third side portion has a right angle shape.

15. The electronic device of claim 13, wherein the first flat portion and the second flat portion are attached with spot welding using a laser.

* * * * *